United States Patent
Maeda et al.

(10) Patent No.: US 10,615,170 B2
(45) Date of Patent: Apr. 7, 2020

(54) SEMICONDUCTOR MEMORY DEVICE

(71) Applicant: TOSHIBA MEMORY CORPORATION, Minato-ku (JP)

(72) Inventors: Yuya Maeda, Yokkaichi (JP); Hidenori Miyagawa, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/904,637

(22) Filed: Feb. 26, 2018

(65) Prior Publication Data
US 2019/0088673 A1 Mar. 21, 2019

(30) Foreign Application Priority Data
Sep. 19, 2017 (JP) ................... 2017-179197

(51) Int. Cl.
*H01L 27/11582* (2017.01)
*H01L 29/167* (2006.01)
*H01L 27/1157* (2017.01)

(52) U.S. Cl.
CPC .... *H01L 27/11582* (2013.01); *H01L 27/1157* (2013.01); *H01L 29/167* (2013.01)

(58) Field of Classification Search
CPC ............. H01L 27/11582; H01L 29/167; H01L 27/11551–11556; H01L 27/11524; H01L 29/42324–42336; H01L 29/788–7889; H01L 27/11529; G11C 2216/06–10; G11C 16/00–349
See application file for complete search history.

(56) References Cited

U.S. PATENT DOCUMENTS

| 9,070,589 | B2 | 6/2015 | Kawai et al. | |
|---|---|---|---|---|
| 9,123,749 | B2 | 9/2015 | Kawai et al. | |
| 2009/0073774 | A1* | 3/2009 | Horesh | G11C 7/12 365/185.25 |
| 2012/0001250 | A1* | 1/2012 | Alsmeier | H01L 27/11551 257/319 |

(Continued)

FOREIGN PATENT DOCUMENTS

| JP | 2014-175348 | 9/2014 |
|---|---|---|
| JP | 2014-179465 | 9/2014 |
| JP | 2017-054981 | 3/2017 |

*Primary Examiner* — Jarrett J Stark
(74) *Attorney, Agent, or Firm* — Oblon, McClelland, Maier & Neustadt, L.L.P.

(57) ABSTRACT

A semiconductor memory device, including: a substrate; a plurality of first conductive layers arranged in a first direction intersecting a surface of the substrate; a channel semiconductor layer extending in the first direction and including a first portion facing the plurality of the first conductive layers and a second portion further from the substrate than the first portion; a memory layer arranged between the first portion of the channel semiconductor layer and the plurality of the first conductive layers and including a memory part capable of storing data; and a first semiconductor layer connected to the second portion of the channel semiconductor layer, the first semiconductor layer including crystalline semiconductor containing a first impurity, and the channel semiconductor layer including a crystal grain having a crystal grain size larger than a thickness thereof.

6 Claims, 20 Drawing Sheets

(56) References Cited

U.S. PATENT DOCUMENTS

| | | | |
|---|---|---|---|
| 2014/0264547 A1* | 9/2014 | Kawai | H01L 29/66833 |
| | | | 257/324 |
| 2015/0061155 A1 | 3/2015 | Seo et al. | |
| 2015/0372005 A1* | 12/2015 | Yon | H01L 27/11582 |
| | | | 257/5 |
| 2016/0268274 A1 | 9/2016 | Kawai et al. | |
| 2017/0077310 A1 | 3/2017 | Oda et al. | |
| 2017/0271349 A1 | 9/2017 | Miyagawa et al. | |
| 2017/0278852 A1 | 9/2017 | Kawai et al. | |
| 2018/0108670 A1* | 4/2018 | Pavlopoulos | H01L 27/11568 |
| 2018/0269277 A1 | 9/2018 | Miyagawa et al. | |

\* cited by examiner

SEMICONDUCTOR MEMORY DEVICE

CROSS-REFERENCE TO RELATED APPLICATIONS

This application is based upon and claims the benefit of Japanese Patent Application No. 2017-179197, filed on Sep. 19, 2017, the entire contents of which are incorporated herein by reference.

BACKGROUND

Field

Embodiments described herein relate to a semiconductor memory device.

Description of the Related Art

Conventionally, a flash memory is widely utilized as a large capacity semiconductor memory device. In recent years, a three-dimensional flash memory has been developed in order to further increase the capacity and commercialized.

One of features of the three-dimensional flash memory is that a channel region extends in a stacking direction of chips. In most conventional cases, the channel region is formed of polysilicon obtained by a rapid thermal annealing (RTA) of amorphous silicon. On the other hand, recently, a method in which amorphous silicon is crystallized by means of a metal induced lateral crystallization (MILC) is proposed. Using this method, it is possible to obtain crystallized silicon having the large crystal grain size same as or close to that of single crystal silicon. Therefore, the electron mobility of the channel region made of the crystallized silicon obtained by MILC is higher than that of the channel region made of the conventional polycrystalline silicon. Therefore, the three-dimensional flash memory having an excellent memory performance can be expected.

It is an object of the embodiments according to the present invention to suppress a reduction of yield that may occur in a process forming channels of memory cells and to provide a semiconductor memory device having improved electric properties of the channel region.

DETAILED DESCRIPTION

A semiconductor memory device, comprising: a substrate; a plurality of first conductive layers arranged in a first direction intersecting a surface of the substrate; a channel semiconductor layer extending in the first direction and including a first portion facing the plurality of the first conductive layers and a second portion further from the substrate than the first portion; a memory layer arranged between the first portion of the channel semiconductor layer and the plurality of the first conductive layers and including a memory part capable of storing data; and a first semiconductor layer connected to the second portion of the channel semiconductor layer, the first semiconductor layer including crystalline semiconductor containing a first impurity, and the channel semiconductor layer including a crystal grain having a crystal grain size larger than a thickness in a second direction of the channel semiconductor layer, the second direction intersecting the first direction.

There will be described in detail semiconductor memory devices according to embodiments with reference to the drawings.

First Embodiment

First, there will be described a summary of a semiconductor memory device according to a first embodiment.

Figure 1:
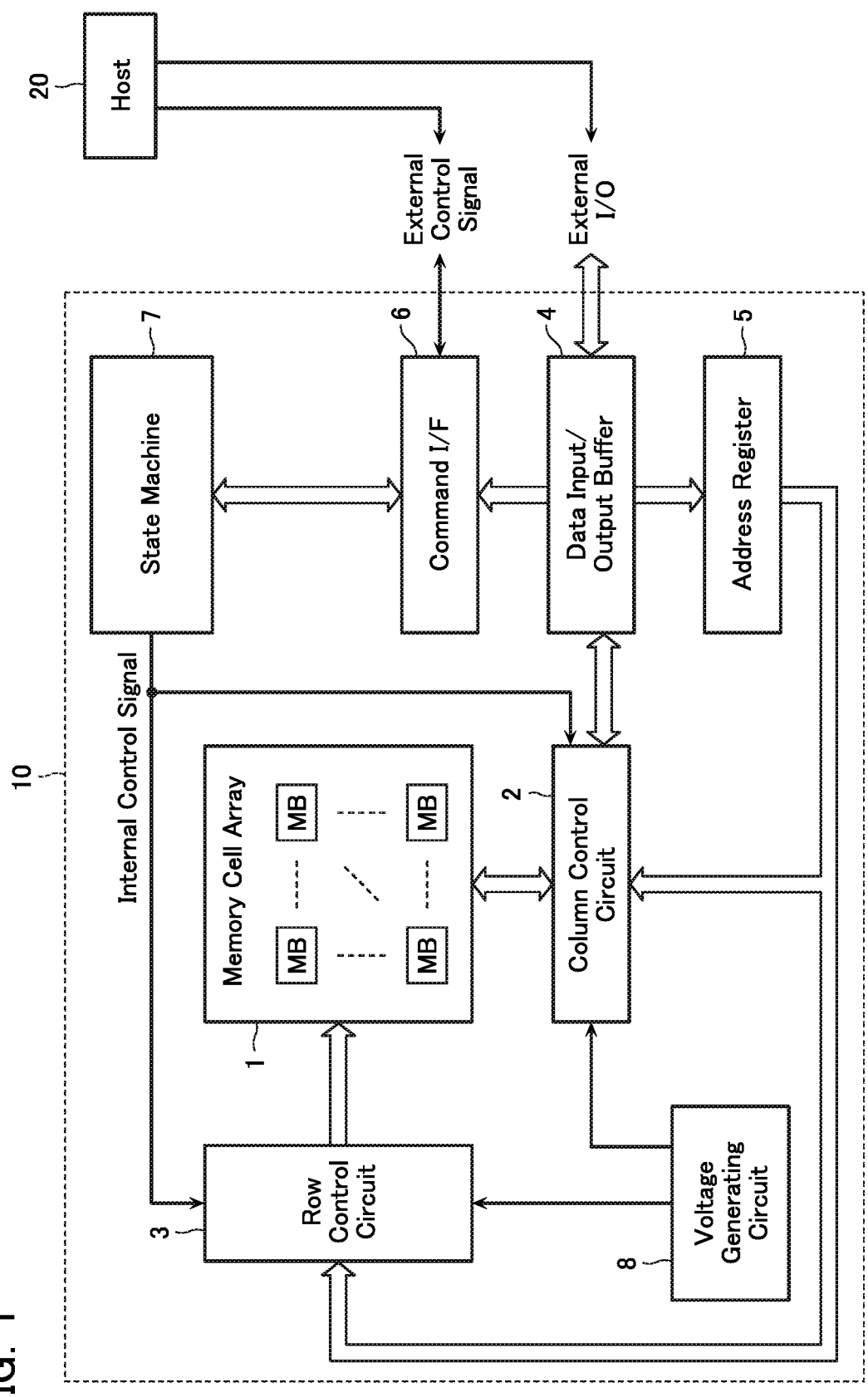
FIG. 1 is a functional block diagram of a semiconductor memory device according to a first embodiment.

FIG. 1 is a functional block diagram of the semiconductor memory device according to the first embodiment.

The semiconductor memory device includes a chip 10 and a host 20 controlling this chip 10. The chip 10 includes a memory cell array 1, a column control circuit 2, a row control circuit 3, a data input/output buffer 4, an address register 5, a command interface 6, a state machine 7, and a voltage generating circuit 8 which control this memory cell array 1. The memory cell array 1 includes a plurality of memory blocks MB. These memory blocks MB each memorizes user data. The column control circuit 2 includes an unshown sense amplifier, and performs read of user data, and so on. Moreover, the column control circuit 2, when performing write of user data, applies a voltage to the memory cell array 1, according to inputted user data. The row control circuit 3 specifies a position for performing read or write of user data in the memory cell array 1, according to inputted address data. The data input/output buffer 4 performs input/output control of user data, address data, and command data. The address register 5 stores address data and supplies the address data to the column control circuit 2 and the row control circuit 3. The state machine 7 receives an external control signal from the host 20, via the command interface 6, and inputs an internal control signal to the column control circuit 2 and the row control circuit 3. The voltage generating circuit 8 generates a voltage and supplies the voltage to the column control circuit 2 and the row control circuit 3.

Figure 2:
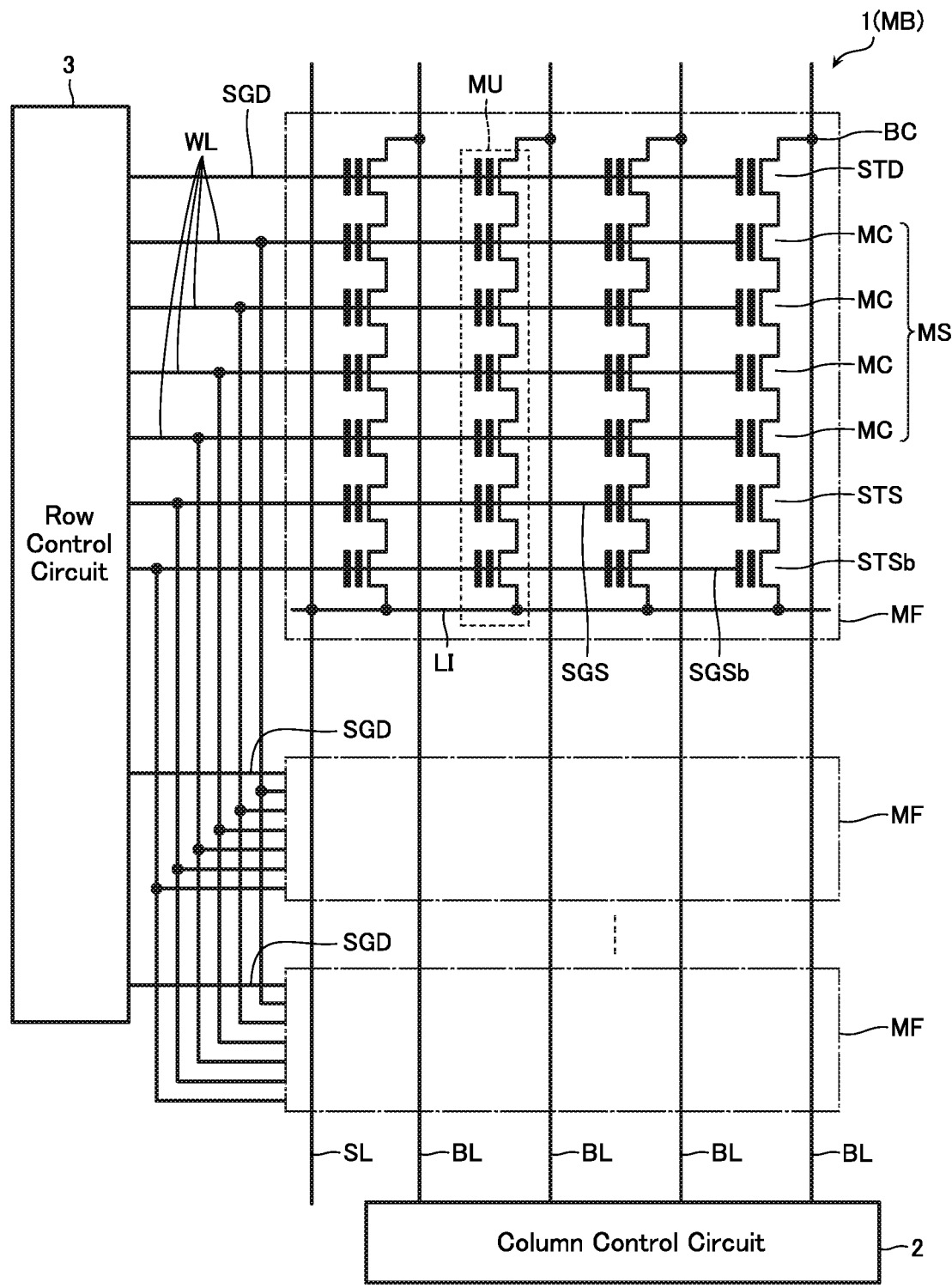
FIG. 2 is an equivalent circuit diagram showing a part of a memory cell array in the semiconductor memory device according to the first embodiment.

FIG. 2 is an equivalent circuit diagram showing a part of the memory cell array 1 (memory blocks MB) according to the first embodiment.

The memory block MB is connected to the column control circuit 2 via bit lines BL, to the row control circuit 3 via word lines WL, and to an unshown source line driver via a source line SL.

The memory block MB includes a plurality of memory fingers MF. Each of the memory fingers MF includes a plurality of memory units MU. All the memory fingers MF belong to the same memory block MB share a plurality of bit lines BL and a source line SL. All the memory units MU belong to the same memory fingers MF share a plurality of word lines ML.

One ends of the plurality of memory units MU are respectively connected to the bit lines BL via bit line contacts BC. On the other hand, the other ends of the plurality of memory units MU are connected to the source line SL via a common source line contact LI. Each of the memory units MU includes a drain side select gate transistor STD, a memory string MS, a source side select gate transistor STS, and a lowermost layer source side select gate transistor STSb which are connected in series between the bit line contact BC and the source line contact LI.

The memory string MS comprises a plurality of memory cells MC connected in series. The memory cell MC is a field effect transistor which includes a semiconductor layer functioning as a channel area, a memory layer provided with a charge accumulating film that is a memory part capable of storing data, and a control gate electrode, and stores a one-bit portion or a multiple-bit portion of data configuring user data. The control gate electrodes of the plurality of memory cells MC belong to the same memory finger MF are connected to the common word lines WL. Note that a resistance change film or the like can be utilized as the memory part instead of the above-described charge accumulating film.

The drain side select gate transistor STD, the source side select gate transistor STS, and the lowermost layer source side select gate transistor STSb are field effect transistors which includes a channel semiconductor layer functioning as a channel area and a control gate electrode. The control gate electrodes of a plurality of the drain side select gate transistors STD belong to the same memory finger MF are connected to a common drain side select gate line SGD. Moreover, the control gate electrodes of a plurality of the source side select gate transistors STS and the lowermost layer source side select gate transistors STSb belong to the same memory block MB are connected to the common source side select gate line SGS and the common lowermost layer source side select gate line SGSb.

Note that in the description below, the lowermost layer source side select gate transistor STSb, the source side select gate transistor STS, and the drain side select gate transistor STD will sometimes simply be called "select gate transistors". Moreover, the lowermost layer source side select gate line SGSb, the source side select gate line SGS, and the drain side select gate line SGD will sometimes simply be called "select gate lines".

Figure 3:
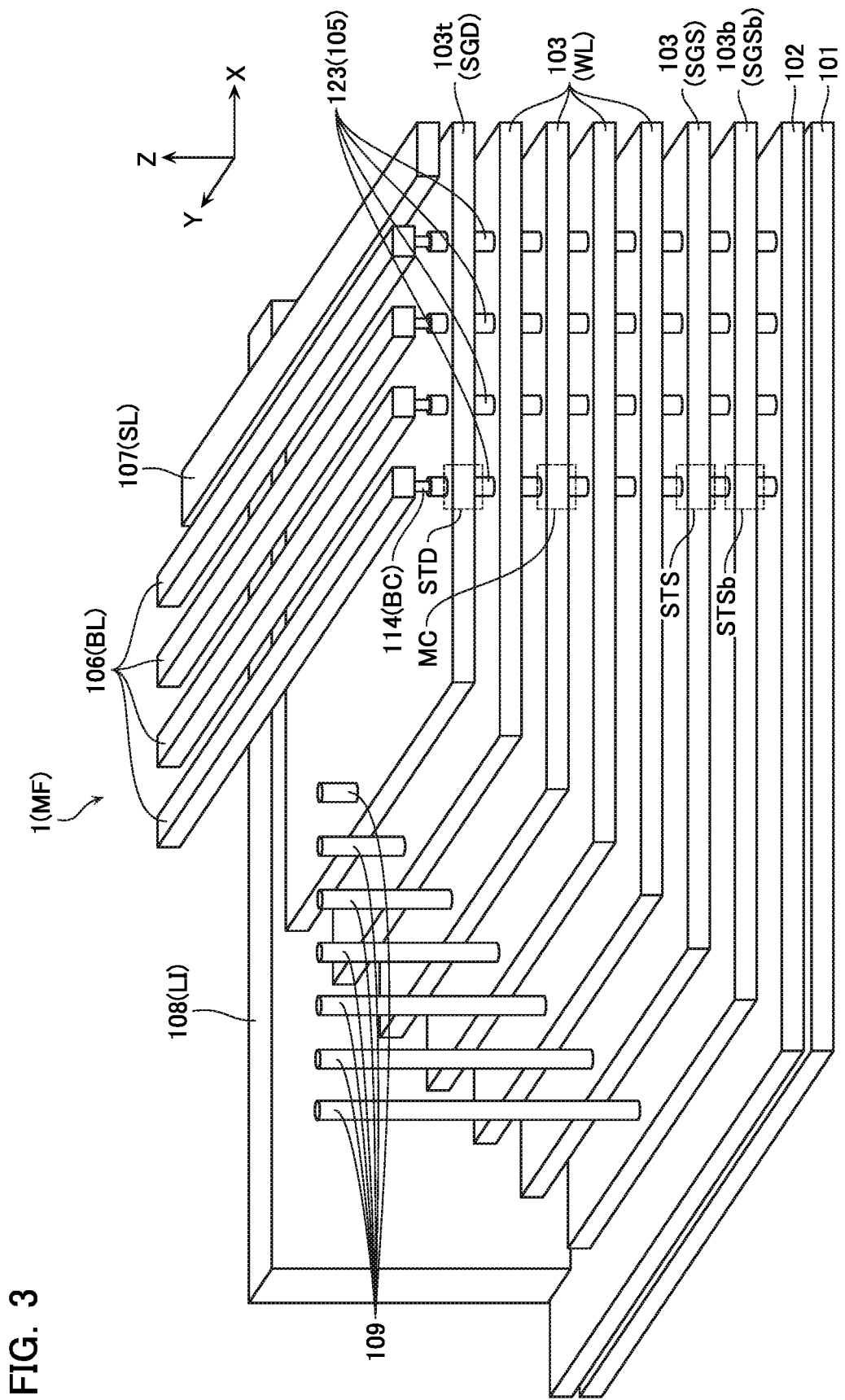
FIG. 3 is a schematic perspective view showing a part of the memory cell array in the semiconductor memory device according to the first embodiment.

FIG. 3 is a schematic perspective view showing a configuration of part of the memory cell array 1 (memory finger MF). Note that FIG. 3 does not show an inter-layer insulating layer provided between the wiring lines, and so on.

The memory finger MF includes a semiconductor substrate 101 having a surface intersecting with a Z direction, a lower semiconductor layer 102 (second semiconductor layer) and a plurality of conductive layers 103 which are stacked above the semiconductor substrate 101 in the Z direction, a memory structure 105 extending in the Z direction through the plurality of conductive layers 103, and a conductive layer 108 adjacent to the conductive layers 103 in the Y direction. The plurality of the memory fingers MF shares a plurality of conductive layers 106 and a conductive layer 107 arranged above the conductive layers 103.

The semiconductor substrate 101 is formed of, for example, single crystal silicon (Si) or the like. The semiconductor substrate 101 has a double well structure including an N type impurity layer arranged in the upper part of the semiconductor substrate and a P type impurity layer arranged in this N type impurity layer.

The lower semiconductor layer 102 electrically connects the memory structure 105 to the conductive layer 108.

The plurality of the conductive layers 103 each functions as the control gate electrodes of the memory cells MC and the word lines WL, or as the control gate electrodes of the select gate transistors STSb, STS and STD and the select gate lines SGSb, SGS and SGD. The conductive layer 103 extends in the XY plane, and has a substantially plate-like shape having the X direction as a longitudinal direction. The conductive layers 103 are each connected to the row control circuit 3 (See FIGS. 1 and 2) via contacts 109 extending in the Z direction. The contact 109 is formed of, for example, tungsten (W) or the like. Note that in the description below, when it is necessary to refer particularly either of the lowermost layer 103 and the upper most layer 103 among the plurality of the conductive layers 103, they may be distinguished from each other under reference numerals 103b and 103t, respectively. In the case of FIG. 3, the conductive layer 103b functions as the lowermost layer source side select gate line SGSb and the conductive layer 103t functions as the drain side select gate line SGD.

The memory structure 105 is a substantially circular column extending in the Z direction. An intersection of the memory structure 105 and the conductive layer 103 functions as the memory cell MC or one of the select gate transistors STSb, STS and STD. The memory structure 105 includes a channel semiconductor layer 123 extending in the Z direction.

The plurality of the conductive layers 106 and the conductive layer 107 extend in the Y direction and are arranged in the Y direction above the conductive layers 103. The plurality of the conductive layers 106 function as the plurality of the bit lines BL. Moreover, the conductive layer 107 functions as the source line SL. In this case, the conductive layers 106 and the conductive layer 107 are formed of, for example, tungsten (W) or the like. The conductive layer 108 extends in the ZX plane, and has a substantially plate-like shape having the X direction as a longitudinal direction. It is electrically connected to the lower conductive layer 102 at the lower part and to an unshown source line driver via the conductive layer 107 at the upper part. The conductive layer 108 functions as a source line contact LI.

The side surface of the channel semiconductor layer 123 in the memory structure 105 surfaces the plurality of the conductive layers 103, and functions as a channel area of the memory cells MC and the select gate transistors STSb, STS and STD. The channel semiconductor layer 123 is in contact with the lower semiconductor layer 102 at the lower part thereof and electrically connected to the conductive layer 108 via the lower semiconductor layer 102. Moreover, the channel semiconductor layer 123 is connected to the conductive layer 114 functioning as the bit line contact BC at the upper end thereof. The conductive layer 114 is electrically connected to the column control circuit 2 (See FIGS. 1 and 2) via the conductive layer 106. The conductive layer 114 is formed of, for example, tungsten (W) or the like.

Figure 4:
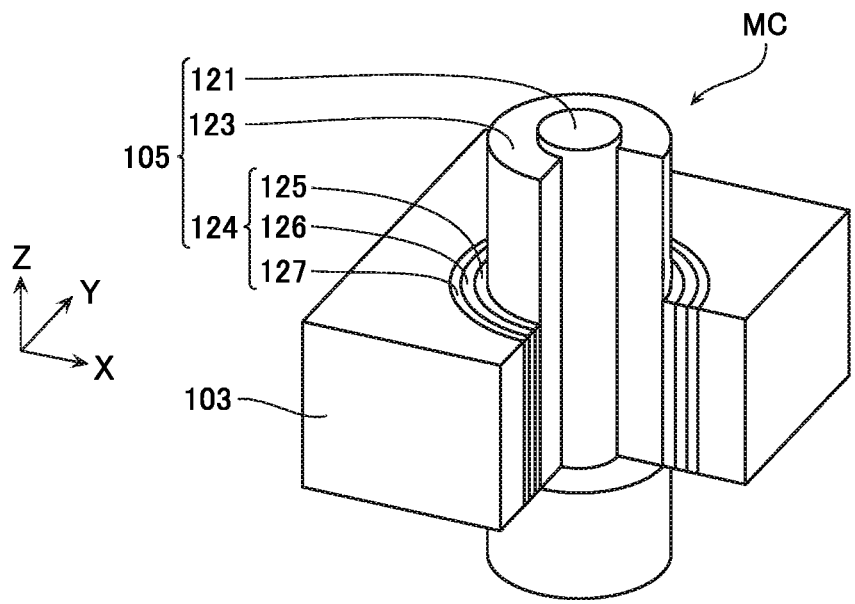
FIG. 4 is a schematic perspective view showing a part of the memory cell array in the semiconductor memory device according to the first embodiment.

FIG. 4 is a schematic perspective view showing a part (memory cell MC) of the memory cell array in the semiconductor memory device according to the first embodiment. Note that FIG. 4 shows the memory cell MC, but the select gate transistors STSb, STS and STD may also be configured similarly to the memory cell MC.

The memory cell MC is arranged at an intersection of the conductive layer 103 and the memory structure 105. The memory structure 105 includes a core insulating layer 121 of a circular column shape extending in the Z direction, a cap semiconductor layer 122 (See FIG. 5), described below, arranged on the core insulating layer 121, the channel semiconductor layer 123 of a substantially cylindrical shape covering the side surfaces of the core insulating layer 121 and the cap semiconductor layer 122, and a memory layer 124 of a substantially cylindrical shape covering the side surface of the channel semiconductor layer 123. Moreover, the memory layer 124 includes a tunnel insulating layer 125 (first insulating layer) covering the side surface of the channel semiconductor layer 123, a charge accumulation layer 126 covering a side surface of the tunnel insulating layer 125, and a block insulating layer 127 (second insulating layer) covering a side surface of the charge accumulation layer 126.

Next, there will be described the structure of the memory cell array 1 in detail. Note that the memory cell array 1 according to the first embodiment is denoted by a reference numeral 100 in order to distinguish from a memory cell array 1 according to the other embodiments.

Figure 5:
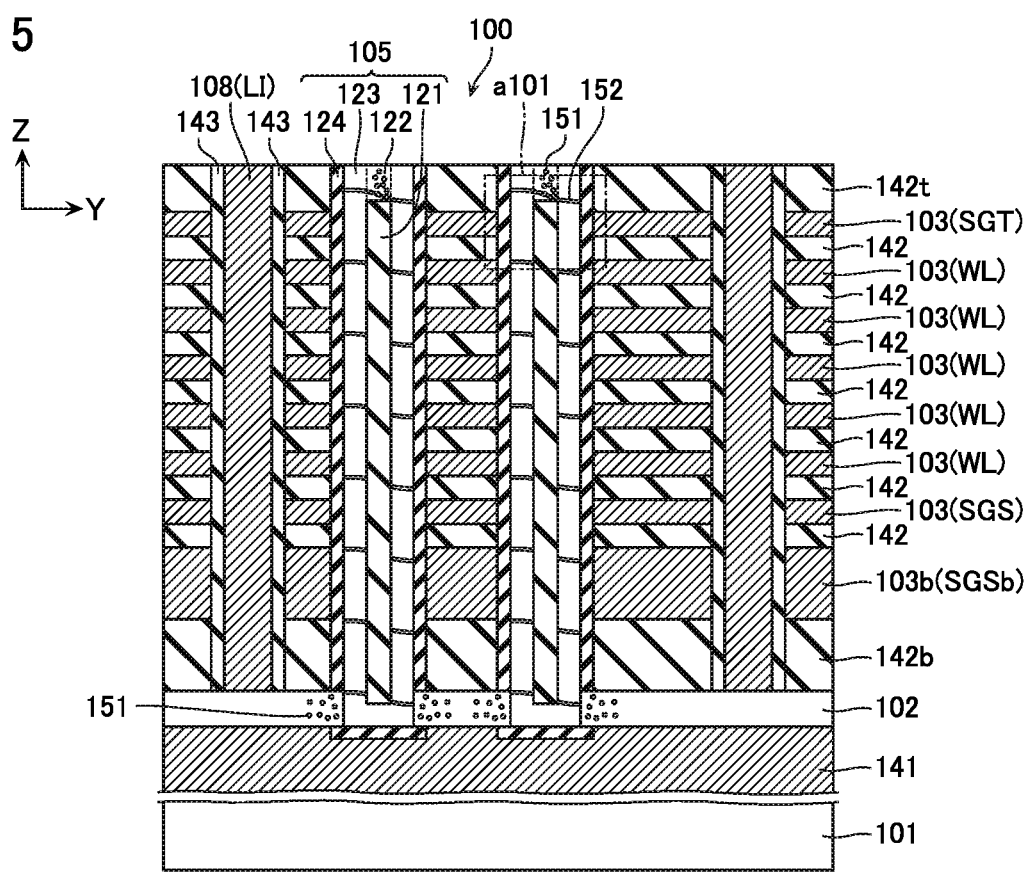
FIG. 5 is a schematic cross-sectional view showing a part of the memory cell array in the semiconductor memory device according to the first embodiment.
Figure 6:
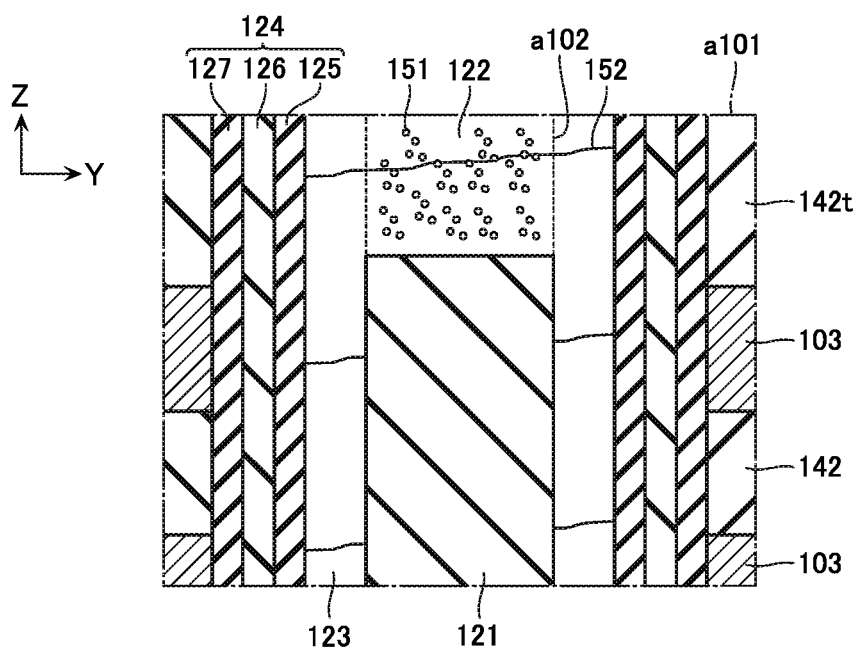
FIG. 6 is a schematic cross-sectional view showing a part of the memory cell array in the semiconductor memory device according to the first embodiment.

FIG. 5 is a schematic cross-sectional view showing a part of the memory cell array 100 in the semiconductor memory device according to the first embodiment. FIG. 6 is an enlarged view of the region a101 surrounded by a dot-and-dash line. FIGS. 5 and 6 are cross-sectional views along Y-Z plane.

As shown in FIG. 5, the memory cell array 100 includes a conductive layer 141 and the lower semiconductor layer 102 which are stacked in the Z direction on the semiconductor substrate 101. Note that the conductive layer 141 is formed of, for example, polycrystalline silicon (Poly-Si), tungsten (W), or stacked structure of these materials. If necessary, an interlayer insulating layer formed of, for example, silicon dioxide ($SiO_2$) or the like may be arranged between the semiconductor substrate 101 and the conductive layer 141. The lower semiconductor layer 102 is formed of, for example, polycrystalline semiconductor such as polycrystalline silicon doped with impurity such as phosphorus (P) at a concentration of $10^{20}/cm^3$ or more. Besides, metal atoms 151 (first metal) such as nickel (Ni) recovered from the channel semiconductor layer 123 is mixed into the lower semiconductor layer 102 in a production process described later.

Furthermore, the memory cell array 100 includes interlayer insulating layers 142 and conductive layers 103 which are stacked in the Z direction on the semiconductor substrate 102. In this case, the interlayer insulating layer 142 is formed of, for example, silicon dioxide ($SiO_2$) or the like. The conductive layer 103 is formed of, for example, tungsten (W) or the like and functions as select gate lines SGSb and SGS, the word line WL, or the select gate line SGD. Note that in the description below, when it is necessary to refer particularly either of the lowermost interlayer insulating layer 142 and the upper most interlayer insulating layer 142 among the plurality of the interlayer insulating layer 142, they may be distinguished from each other under reference numerals 142b and 142t, respectively.

The memory cell array 100 includes the memory structure 105 of a substantially circular column shape which penetrates through the lower semiconductor layers 102, the conductive layers 103, the interlayer insulating layers 142 and contacts an upper part of the conductive layer 141. The memory structure 105 includes the core insulating layer 121 of a substantially circular column shape, arranged in the center thereof, the cap semiconductor layer 122 (first semiconductor layer) arranged on the core insulating layer 121, the channel semiconductor layer 123 having a substantially bottomed cylindrical shape and covering the bottom surface of the core insulating layer 121 and the side surfaces of the core insulating layer 121 and the cap semiconductor layer 122, and the memory layer 124. The channel semiconductor layer includes a first portion facing the plurality of the conductive layers 103, a second portion further from the substrate 101 than the first portion and covering the side surface of the cap semiconductor layer 122, and a third portion nearer to the substrate 101 and having a side surface covered by the lower semiconductor layer 102. The memory layer 124 includes the tunnel insulating layer 125, the charge accumulating film 126 and the block insulating layer 127, which are arranged between the core insulating layer 121 and the conductive layer 103.

Here, the core insulating layer 121 is formed of, for example, silicon dioxide ($SiO_2$) or the like. The cap semiconductor layer 122 is formed of, for example, silicon (Si) doped with impurity such as phosphorus (P) at a concentration of $10^{20}/cm^3$ or more. The channel semiconductor layer 123 is formed of, for example, silicon (Si).

Reference numeral 152 in FIGS. 5 and 6 denotes a crystal grain boundary in the cap semiconductor layer 122 and the channel semiconductor layer 123. Although the cap semiconductor layer 122 and the channel semiconductor layer 123 are distinguished from each other by a dot line a102 in FIGS. 5 and 6 for convenience, as seen from the condition of a crystal grain boundary 152, it does not mean that the cap semiconductor layer 122 and the channel semiconductor layer 123 are divided at the position of the dot line a102. That is, the cap semiconductor layer 122 and the channel semiconductor layer 123 share crystal grains. Each of these crystal grains includes a part of the cap semiconductor layer 122 and a part of the channel semiconductor layer 123. These crystal grains are not divided at the position of the dot line a102. Each of these crystal grains has a uniform plane orientation.

Moreover, the cap semiconductor layer 122 and the channel semiconductor layer 123 are formed of a single crystal silicon or a crystalline silicon having a crystal grain size larger than the thickness of the channel semiconductor layer 123 and close to a single crystal silicon. Here, the "crystal grain size" means, for example, a maximum width when the width has been measured from a plurality of directions for the crystal grain. Additionally, the "thickness of the channel semiconductor layer 123" means, for example, a thickness of the channel semiconductor layer 123 in XY plane (a distance between the core insulating layer 121 and the memory layer 124).

Moreover, metal atoms 151 such as nickel (Ni) recovered from the channel semiconductor layer 123 is mixed into the cap semiconductor layer 122 like the lower semiconductor layer 102. Note that since the concentration of the metal atoms in the cap semiconductor layer 122 is less than $5 \times 10^{20}/cm^3$, the cap semiconductor layer 122 is formed of the material different from silicide on this point. The above-described structural characteristics of the cap semiconductor layer 122 and the channel semiconductor layer 123 are caused by the production process of the memory cell array described later.

The tunnel insulating layer 125 is formed of, for example, silicon dioxide ($SiO_2$) or the like. The charge accumulating film 126 is formed of a material capable of accumulating charge, for example, silicon nitride ($Si_3N_4$). The block insulating layer 127 is formed of, for example, silicon dioxide ($SiO_2$) or alumina ($Al_2O_3$).

Moreover, the memory cell array 100 includes the conductive layer 108 extending in the X direction and arriving at the upper face of the interlayer insulating layer 142t from the upper surface of the lower semiconductor layer 102 in the Z direction. The conductive layer 108 functions as the source line contact LI and is in contact with the lower semiconductor layer 102 on the bottom surface thereof. The conductive layer 108 is formed of, for example, tungsten (W) or the like. In the memory cell array 100, an interlayer insulating layer 143 is arranged between the conductive layer 108 and the conductive layers 103 in the X direction in order to insulate between them. The interlayer insulating layer 143 is formed of, for example, silicon dioxide ($SiO_2$) or the like.

There will be described a method of manufacturing the memory cell array 100 with reference to FIGS. 7 to 25.

Figure 7:
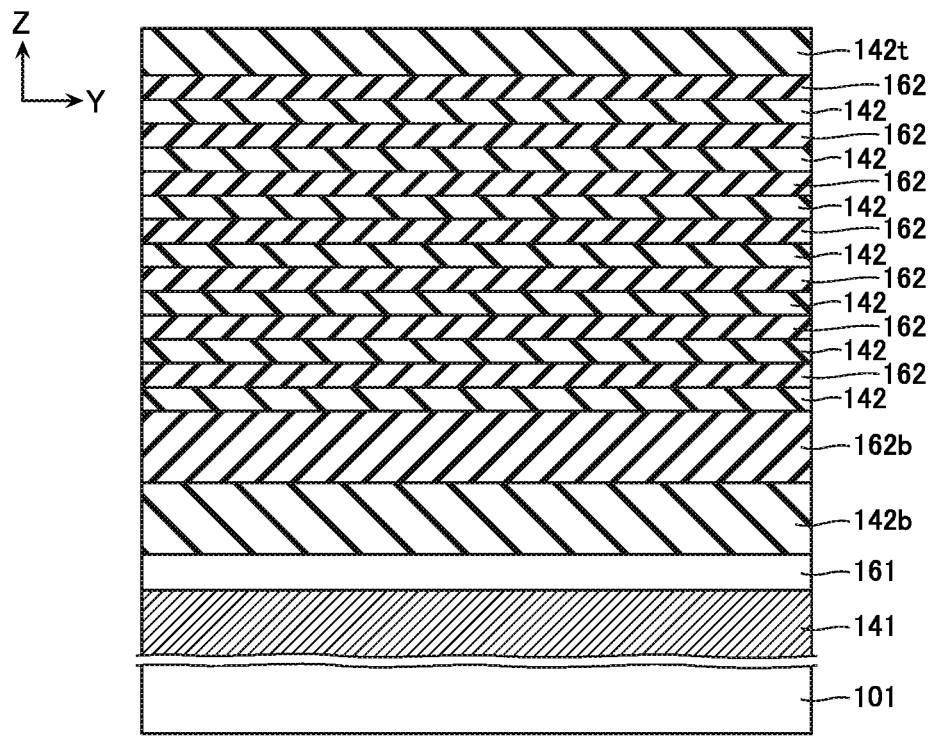
FIG. 7 is a view for describing a method of manufacturing the memory cell array in the semiconductor memory device according to the first embodiment.

First, as shown in FIG. 7, a conductive layer 141 and a sacrifice layer 161 are stacked sequentially in the Z direction above the semiconductor substrate 101. Then, a plurality of the interlayer insulating layers 142 and a plurality of sacrifice layers 162 are stacked alternately. Note that the lowermost layer and uppermost layer among the interlayer insulating layers 142 are an interlayer insulating layer 142b and an interlayer insulating layer 142t, respectively. In the description below, when it is necessary to refer particularly either of the lowermost sacrifice layer 162 among the plurality of the sacrifice layers 162, it may be distinguished from the other sacrifice layer under a reference numeral 162b. The conductive layer 141 is formed of, for example, polycrystalline silicon (Poly-Si), tungsten (W), or stacked structure of these materials. The interlayer insulating layer is formed of, for example, silicon dioxide ($SiO_2$). The sacrifice layer 161 is the layer to be substituted for the lower semiconductor layer 102 in the following process, and is formed of, for example, silicon (Si). The sacrifice layers 162b, 162 are the layers to be substituted for the conductive layers 103b, 103 in the following process, and are formed of, for example, silicon nitride ($Si_3N_4$).

Figure 8:
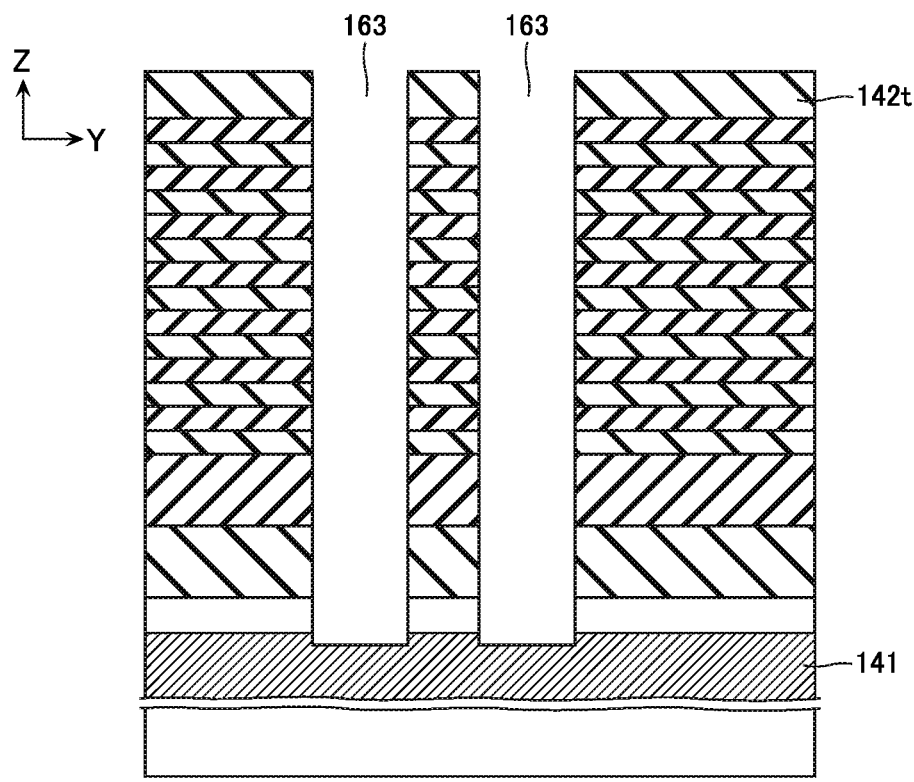
FIG. 8 is a view for describing a method of manufacturing the memory cell array in the semiconductor memory device according to the first embodiment.

Subsequently, as shown in FIG. 8, memory holes 163 extending from the interlayer insulating layer 142t to the upper part of the conductive layer 141 in the Z direction are formed by means of, for example, a reactive ion etching (RIE) or the like.

Figure 9:
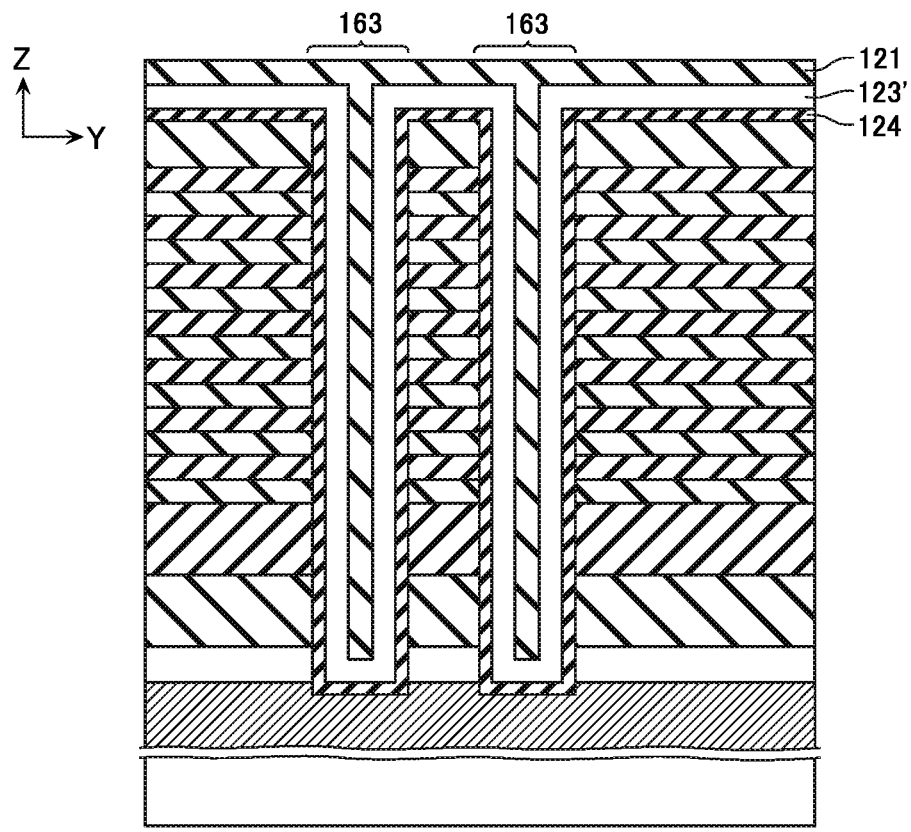
FIG. 9 is a view for describing a method of manufacturing the memory cell array in the semiconductor memory device according to the first embodiment.

Subsequently, as shown in FIG. 9, the memory layer 124, a semiconductor layer 123', and the core insulating layer 121 are sequentially formed in the memory holes 163 by means of, for example, a chemical vapor deposition (CVD) or the like. Film forming of the memory layer 124 is performed by sequentially forming the block insulating layer 127, the charge accumulating layer 126, and the tunnel insulating layer 125 in the memory holes 163. The block insulating layer 127 is formed of, for example, silicon dioxide ($SiO_2$), alumina ($Al_2O_3$) or the like. The charge accumulating layer 126 is formed of, for example, silicon nitride ($Si_3N_4$) or the like. The tunnel insulating layer 125 is formed of, for example, silicon dioxide ($SiO_2$) or the like. The semiconductor layer 123' is the layer which becomes the channel semiconductor layer 123 in the following process, and is formed of, for example, amorphous silicon (a-Si). The core insulating layer 121 is formed of, for example, silicon dioxide ($SiO_2$).

Figure 10:
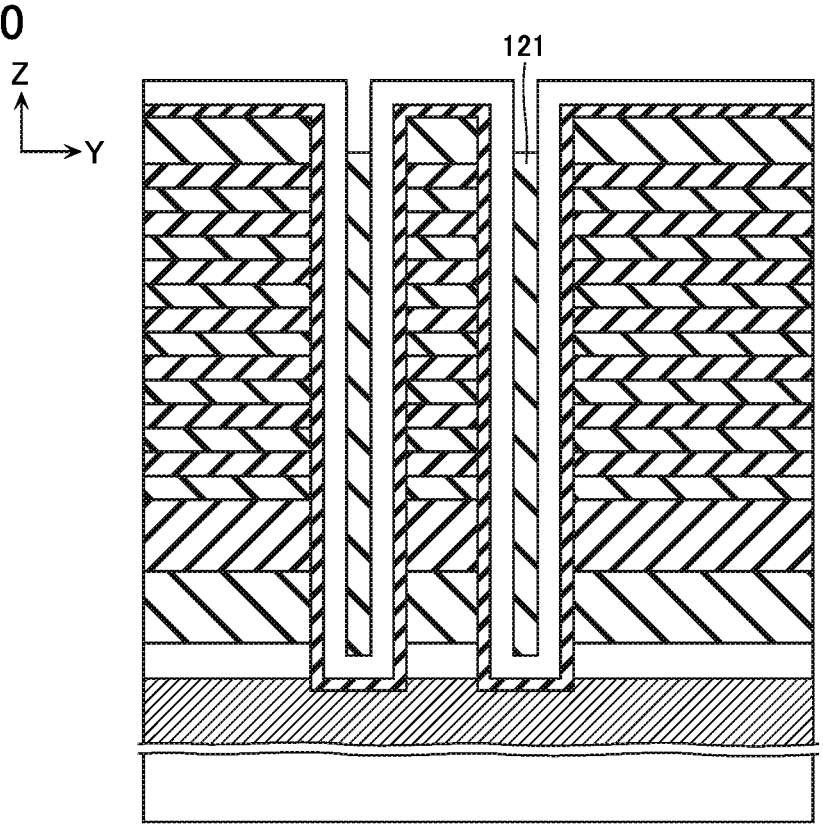
FIG. 10 is a view for describing a method of manufacturing the memory cell array in the semiconductor memory device according to the first embodiment.

Subsequently, as shown in FIG. 10, the upper part of the core insulating layer 121 is removed by etching.

Figure 11:
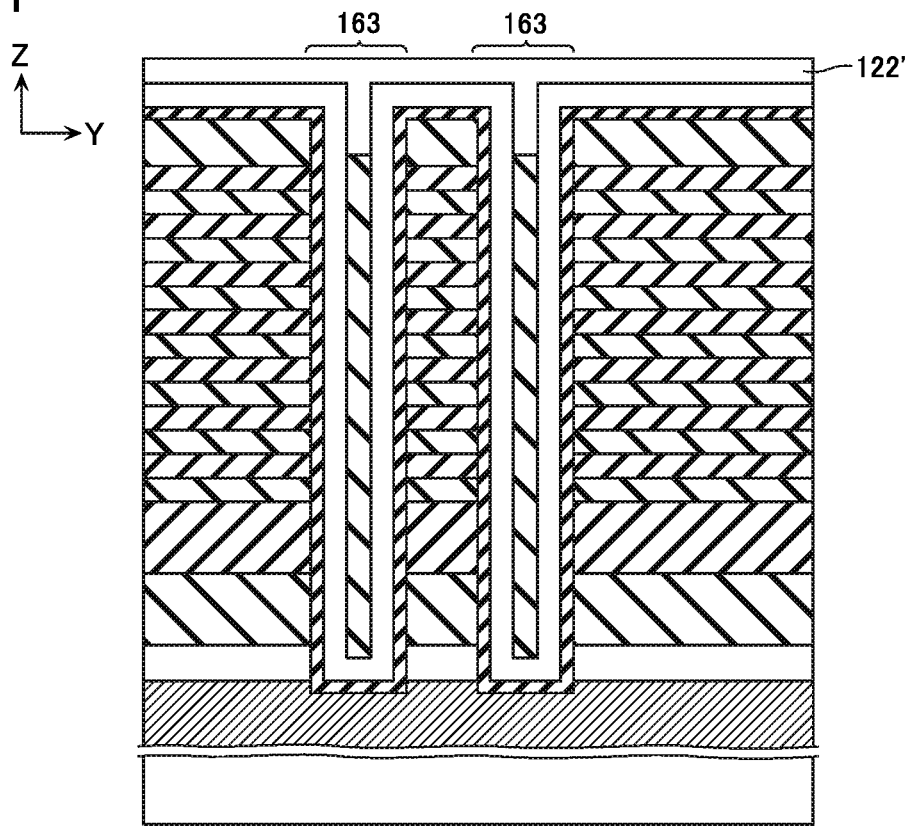
FIG. 11 is a view for describing a method of manufacturing the memory cell array in the semiconductor memory device according to the first embodiment.

Subsequently, as shown in FIG. 11, the semiconductor layer 122' is deposited in the memory holes 163. In this case, the semiconductor layer 122' is the layer which becomes the cap semiconductor layer 122 in the following process, and is formed of, for example, amorphous silicon (a-Si) doped with impurity such as phosphorus (P) at a concentration of $10^{20}/cm^3$ or more.

Figure 12:
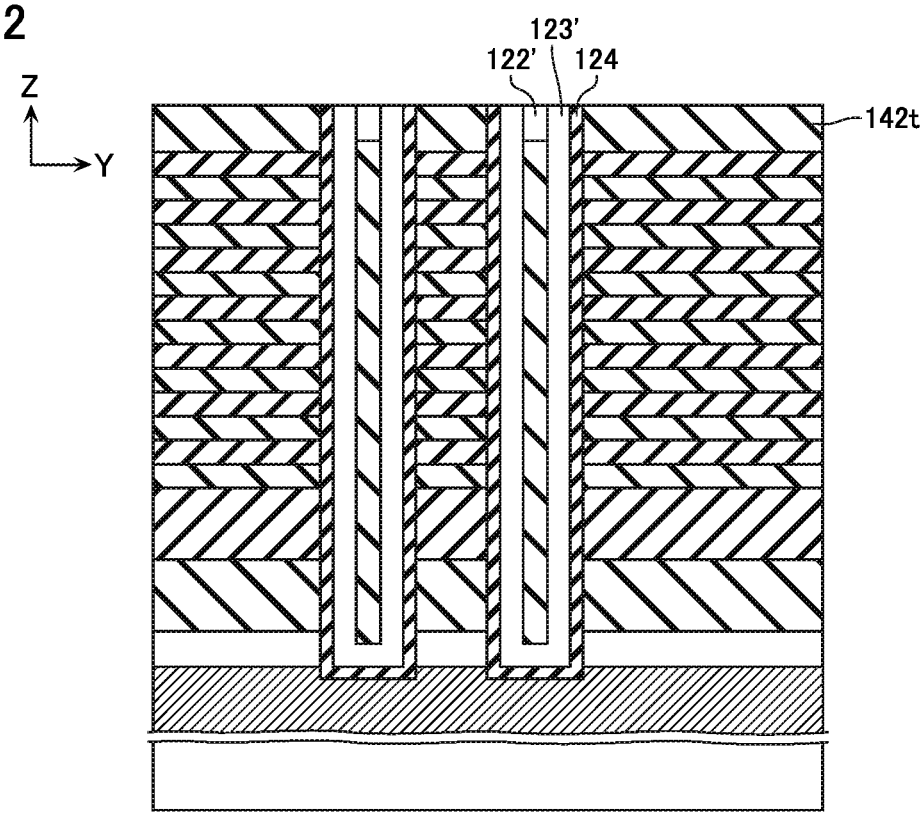
FIG. 12 is a view for describing a method of manufacturing the memory cell array in the semiconductor memory device according to the first embodiment.

Subsequently, as shown in FIG. 12, the semiconductor layers 122', 123' and the memory layer 124 are removed by means of etching back process until the upper surface of the interlayer insulating layer 142t is exposed.

Figure 13:
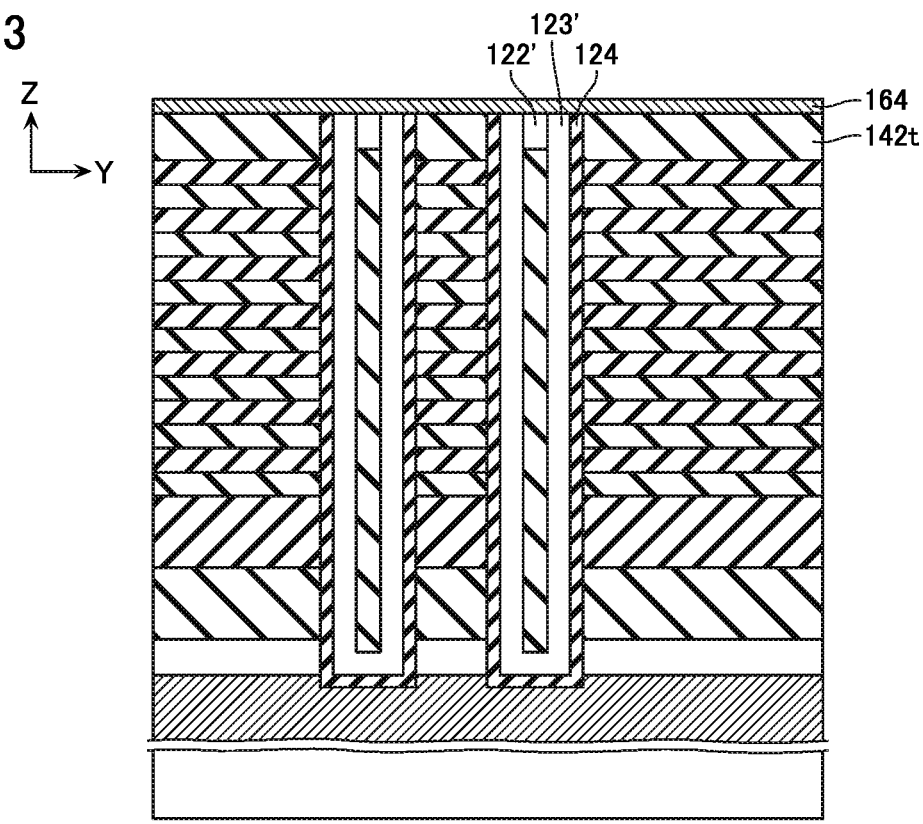
FIG. 13 is a view for describing a method of manufacturing the memory cell array in the semiconductor memory device according to the first embodiment.

Subsequently, as shown in FIG. 13, a metal layer 164 is deposited on the upper surfaces of the semiconductor layers 122', 123', the memory layer 124, and the interlayer insulating layer 142t by means of, for example, a physical vapor deposition (PVD) or the like. The metal layer 164 is formed of, for example, nickel (Ni), cobalt (Co), copper (Cu), palladium (Pd) or the like. Hereinafter, the example in which nickel (Ni) is used is described below.

Figure 14:
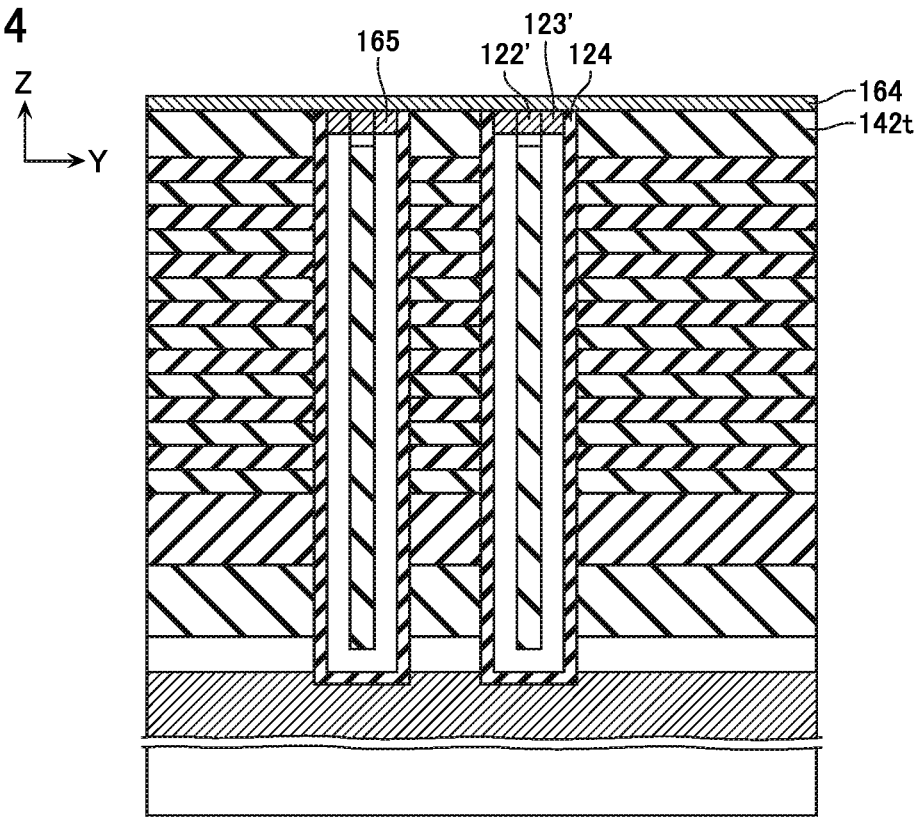
FIG. 14 is a view for describing a method of manufacturing the memory cell array in the semiconductor memory device according to the first embodiment.

Subsequently, as shown in FIG. 14, the metal layer 164 is subjected to heat treatment to diffuse nickel atoms in the metal layer 164 into the semiconductor layers 122', 123'. As a result, a silicide layer 165 is formed in the upper parts of the semiconductor layers 122', 123'. Since nickel silicide has a lattice constant close to that of silicon (Si) crystal, it is suitable for a material constituting the metal layer 164. On the other hand, since nickel (Ni) does not react with silicon dioxide ($SiO_2$) and silicon nitride ($Si_3N_4$), those portions of the metal layer 164 which are in contact with the memory layer 124 and the interlayer insulating layer 142t, is not silicided.

Figure 15:
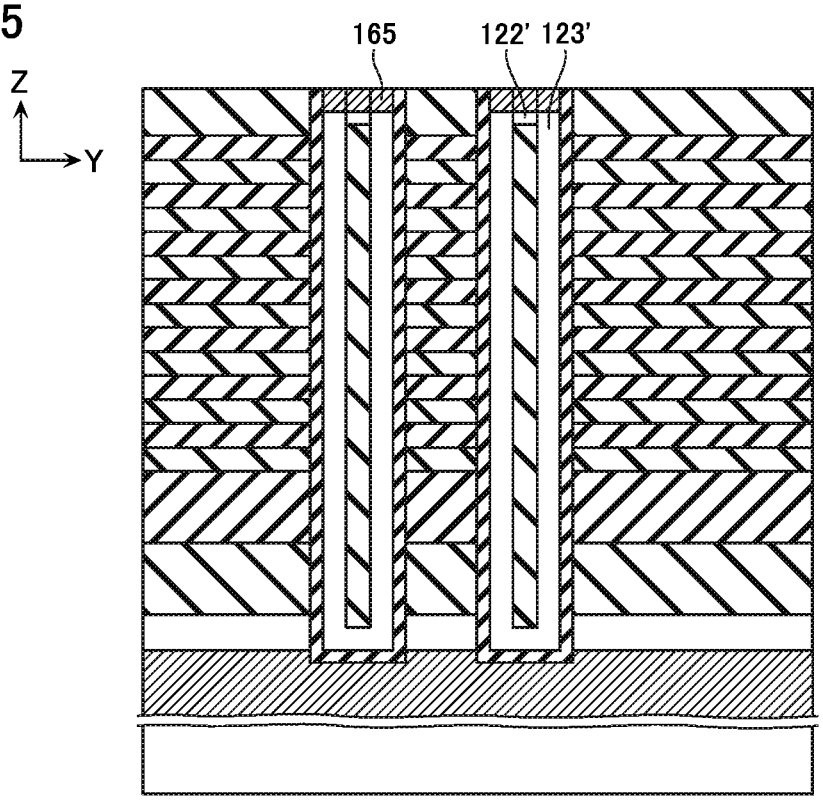
FIG. 15 is a view for describing a method of manufacturing the memory cell array in the semiconductor memory device according to the first embodiment.

Subsequently, as shown in FIG. 15, the metal layer 164 is removed by etching.

Figure 16:
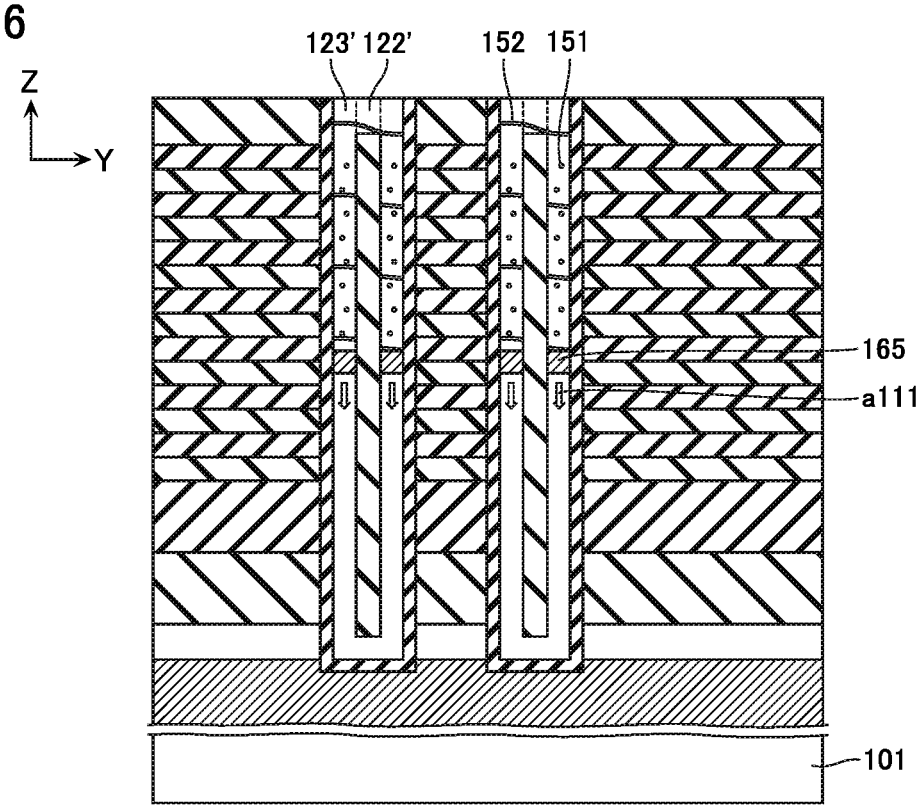
FIG. 16 is a view for describing a method of manufacturing the memory cell array in the semiconductor memory device according to the first embodiment.
Figure 17:
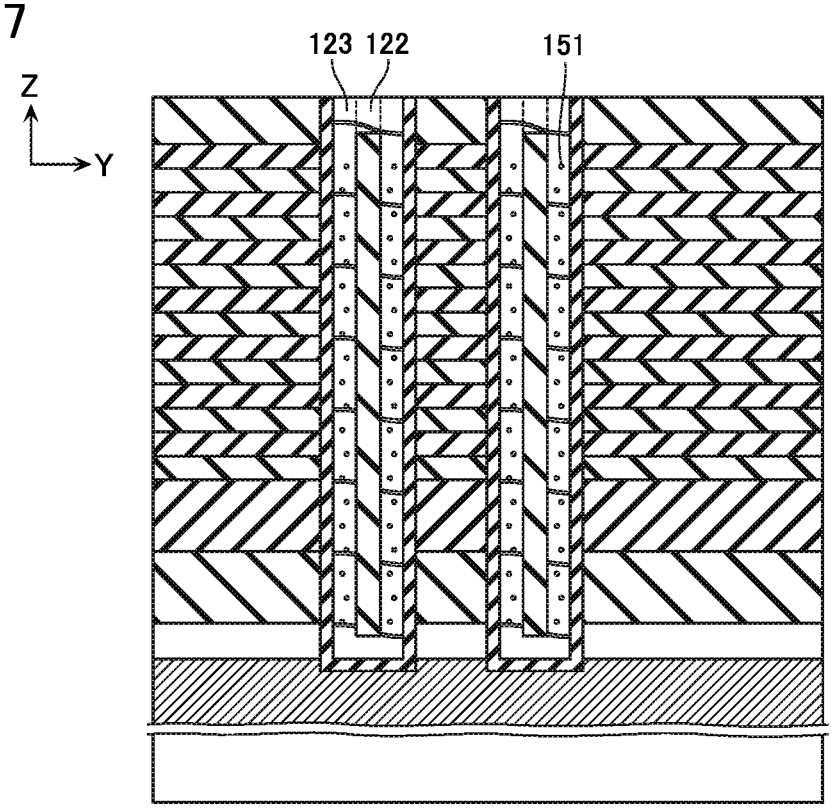
FIG. 17 is a view for describing a method of manufacturing the memory cell array in the semiconductor memory device according to the first embodiment.

Subsequently, as shown in FIG. 16, a metal induced lateral crystallization (MILC) treatment is performed. According to the MILC treatment, the silicide layer 165 passes through the semiconductor layers 122', 123' which are in an amorphous state, toward the semiconductor substrate 101 by heat treatment (void arrow a111 in FIG. 16). In this case, the amorphous silicon constituting the semiconductor layers 122', 123' is reformed to form single crystal silicon or crystalline silicon having a relatively large grain size close to that of single crystal silicon by means of a solid phase epitaxial growth using the silicide layer 165 as a growth end. As a result, as shown in FIG. 17, the semiconductor layers 122', 123' become the cap semiconductor layer 122 and the channel semiconductor layer 123. At this timing, however, the metal atoms 151 of nickel (Ni) remain in the channel semiconductor layer 123.

Figure 18:
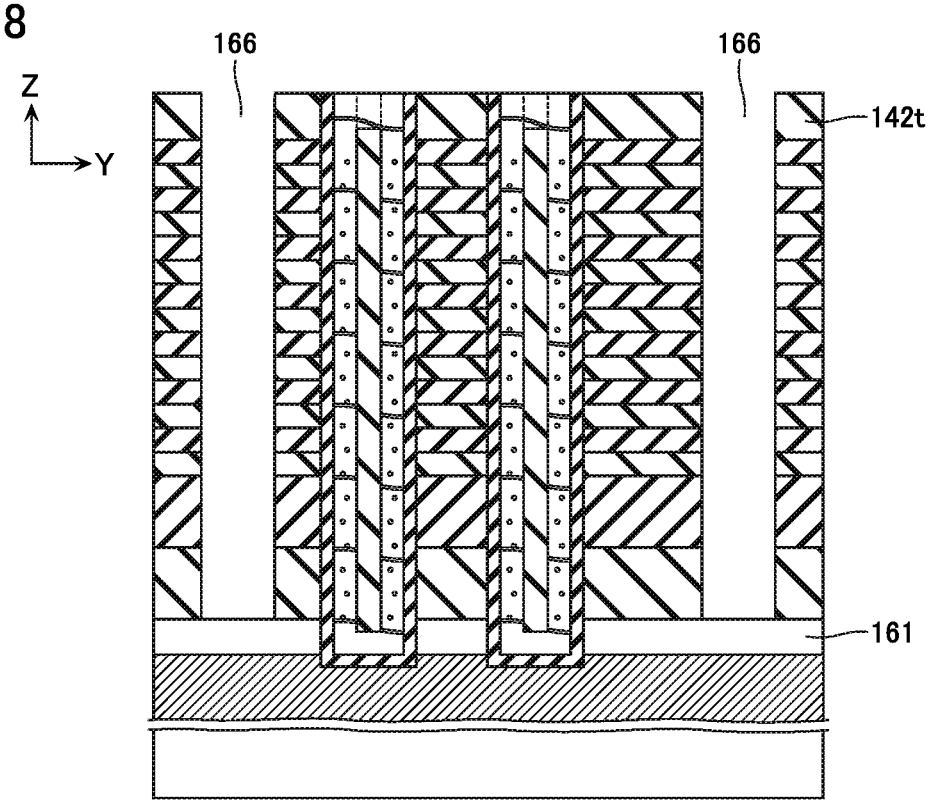
FIG. 18 is a view for describing a method of manufacturing the memory cell array in the semiconductor memory device according to the first embodiment.

Subsequently, as shown in FIG. 18, the resultant structure is subjected to, for example, RIE or the like to form grooves 166 ranging from the interlayer insulating layer 142t to the upper surface of the sacrifice layer 161, in which the depth direction thereof is Z direction and the extending direction thereof is X direction.

Figure 19:
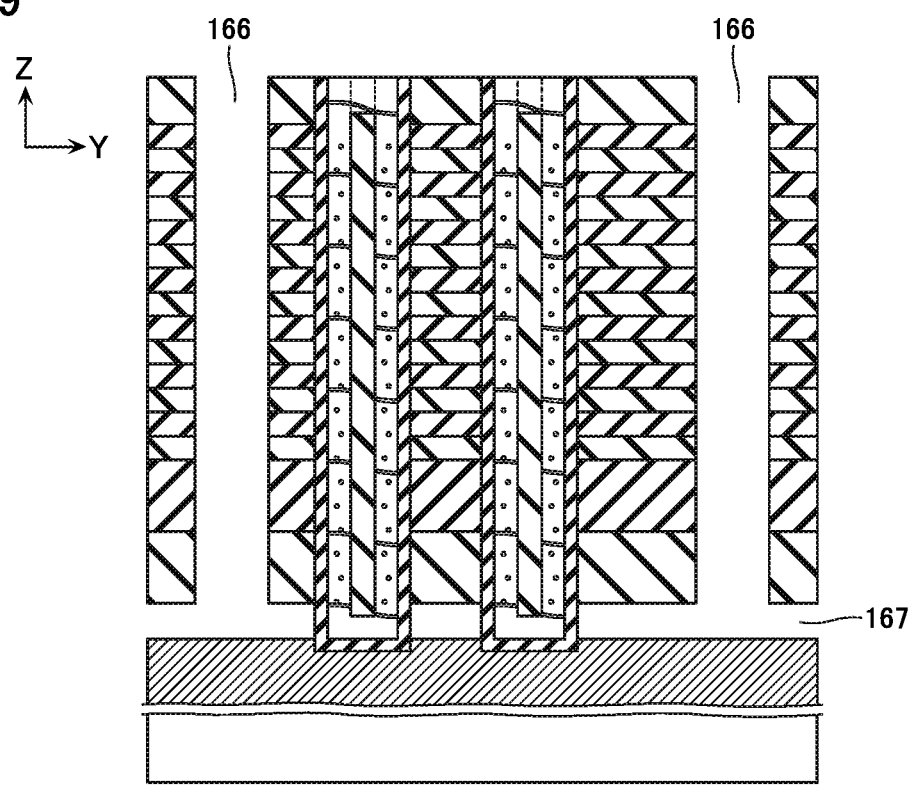
FIG. 19 is a view for describing a method of manufacturing the memory cell array in the semiconductor memory device according to the first embodiment.

Subsequently, as shown in FIG. 19, the sacrifice layer 161 is removed through the grooves 166 by means of a wet etching using a chemical liquid, for example, an aqueous solution of cholin (TMY). As a result, an opening 167 is formed in the place where the sacrifice layer 161 has been removed.

Figure 20:
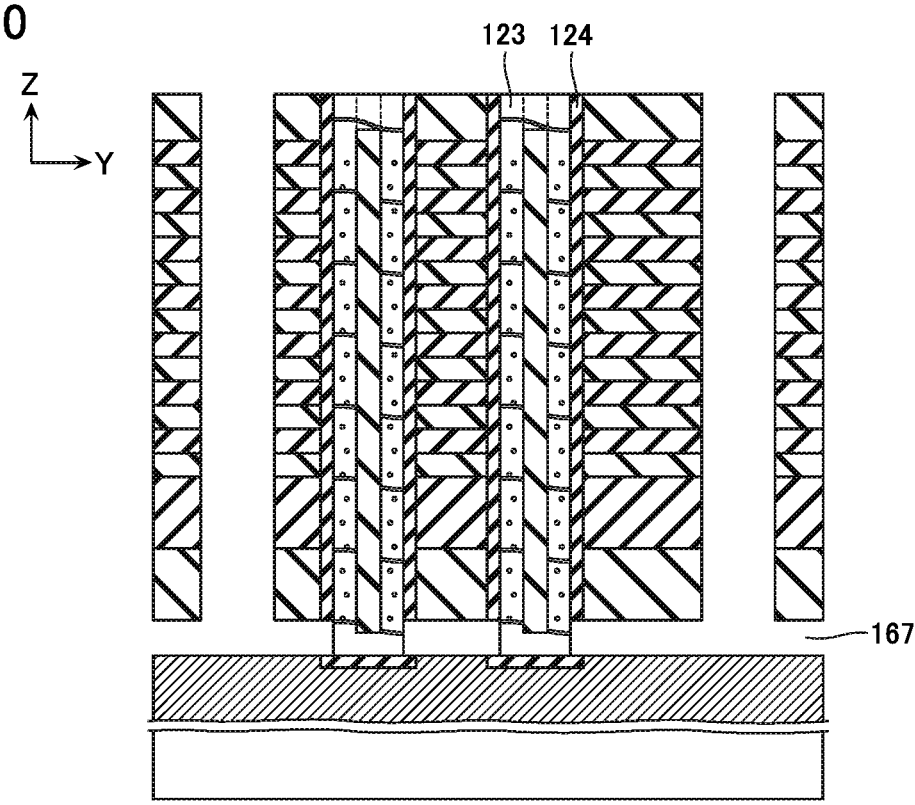
FIG. 20 is a view for describing a method of manufacturing the memory cell array in the semiconductor memory device according to the first embodiment.

Subsequently, as shown in FIG. 20, portions of the memory layer 124 which are exposed to the opening 167 are removed by means of a wet etching using a chemical liquid, for example, a diluted hydrofluoric acid (DHF). As a result, the side surface of the channel semiconductor layer 123 is exposed.

Figure 21:
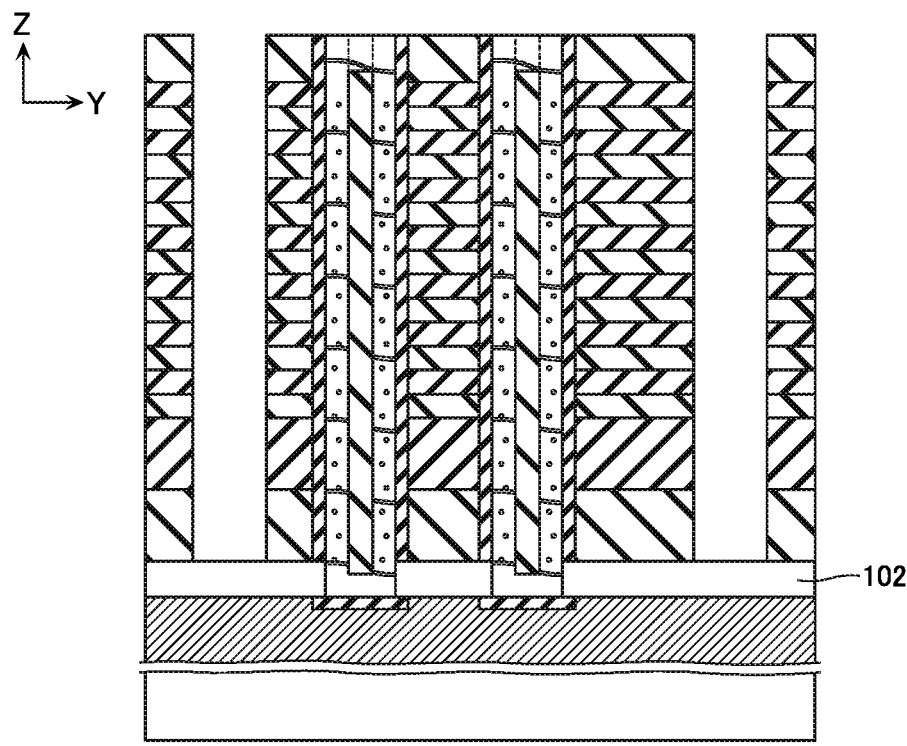
FIG. 21 is a view for describing a method of manufacturing the memory cell array in the semiconductor memory device according to the first embodiment.

Subsequently, as shown in FIG. 21, the opening 167 is filled with the lower semiconductor layer 102. The lower semiconductor layer 102 is formed of polycrystalline silicon doped with impurity such as phosphorus (P) at a concentration of $10^{20}/cm^3$ or more.

Figure 22:
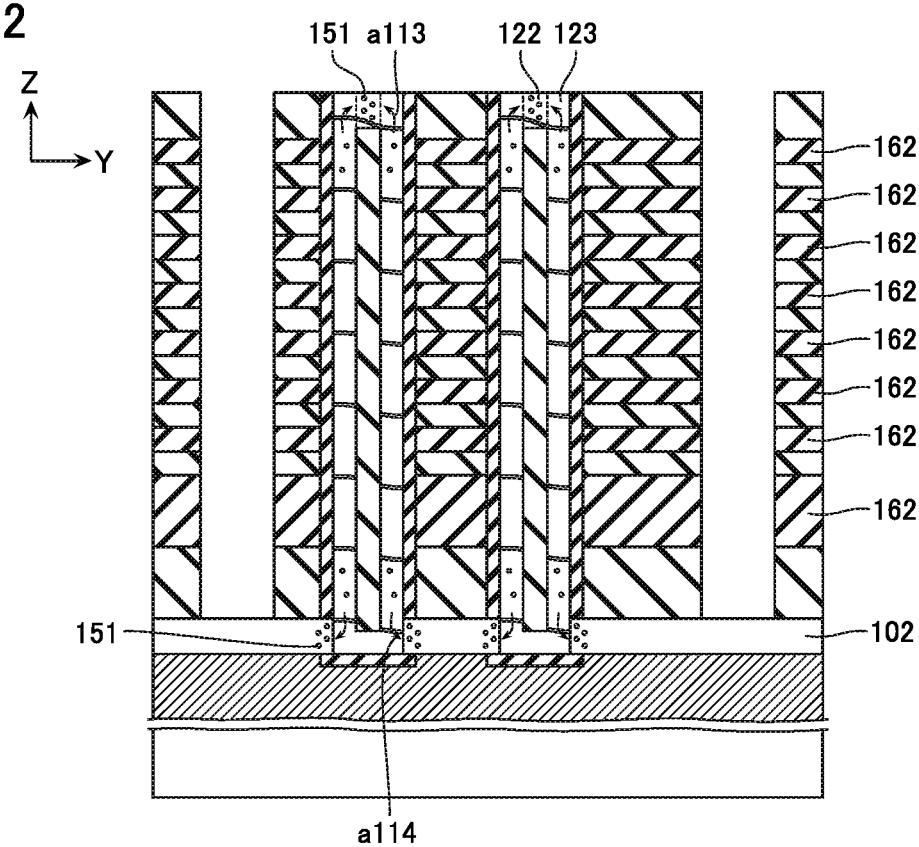
FIG. 22 is a view for describing a method of manufacturing the memory cell array in the semiconductor memory device according to the first embodiment.
Figure 23:
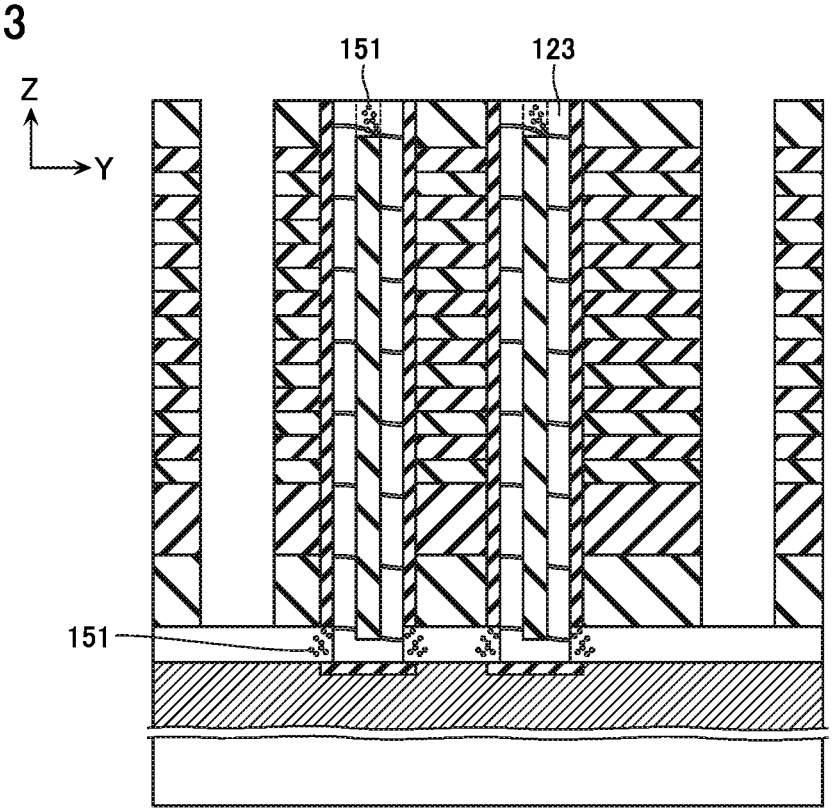
FIG. 23 is a view for describing a method of manufacturing the memory cell array in the semiconductor memory device according to the first embodiment.

Subsequently, as shown in FIG. 22, the channel semiconductor layer 123 is subjected to heat treatment to getter the metal atoms 151 in the channel semiconductor layer 123. Specifically, the metal atoms 151 remained in the upper part of the channel semiconductor layer 123 is recovered in the cap semiconductor layer 122 (arrow a113 in FIG. 22), and the metal atoms 151 remained in the lower part of the channel semiconductor layer 123 is recovered in the lower semiconductor layer 102 (arrow a114 in FIG. 22). The heat treatment in the gettering is performed at a temperature higher than that in the MILC treatment. Moreover, the recovery performance of silicon (Si) doped with phosphorous (P) is higher than that of non-doped silicon (Si). For that reason, in the first embodiment, the lower semiconductor layer 102 and the cap semiconductor layer 122 are doped with phosphorous (P) in advance. According to this step, as shown in FIG. 23, it is possible to obtain the channel semiconductor layer 123 formed of high quality crystalline silicon from which the metal atoms 151 are removed.

Figure 24:
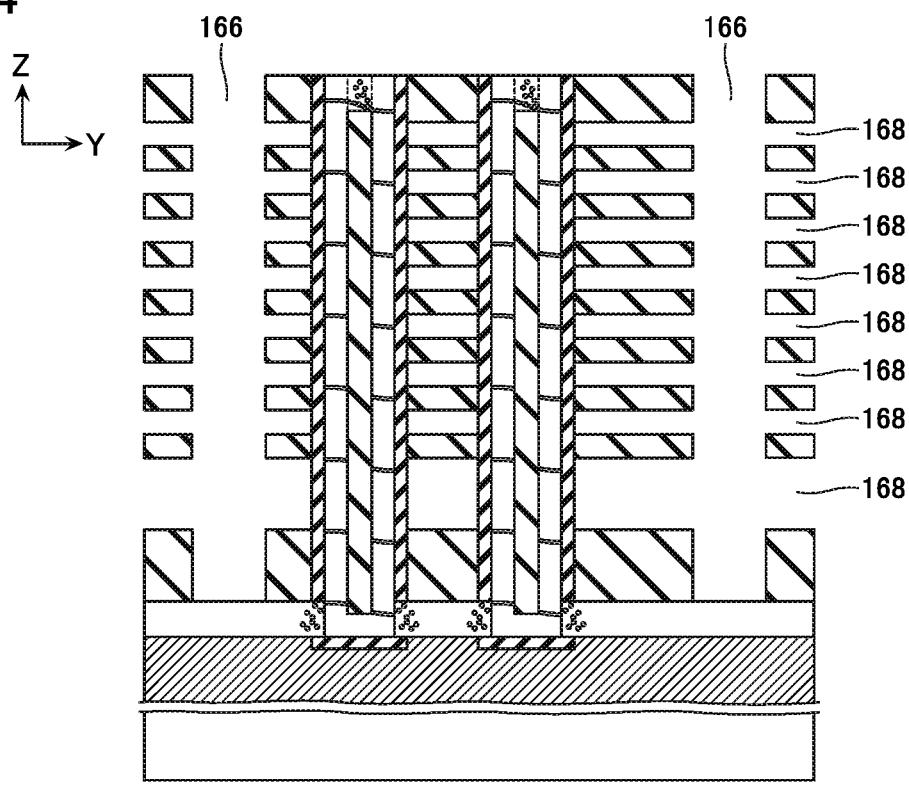
FIG. 24 is a view for describing a method of manufacturing the memory cell array in the semiconductor memory device according to the first embodiment.

Subsequently, as shown in FIG. 24, the sacrifice layer 162 is removed through the grooves 166 by means of a wet etching using a chemical liquid, for example, phosphoric acid ($H_3PO_4$). As a result, an opening 168 is formed in the place where the sacrifice layer 162 has been removed.

Figure 25:
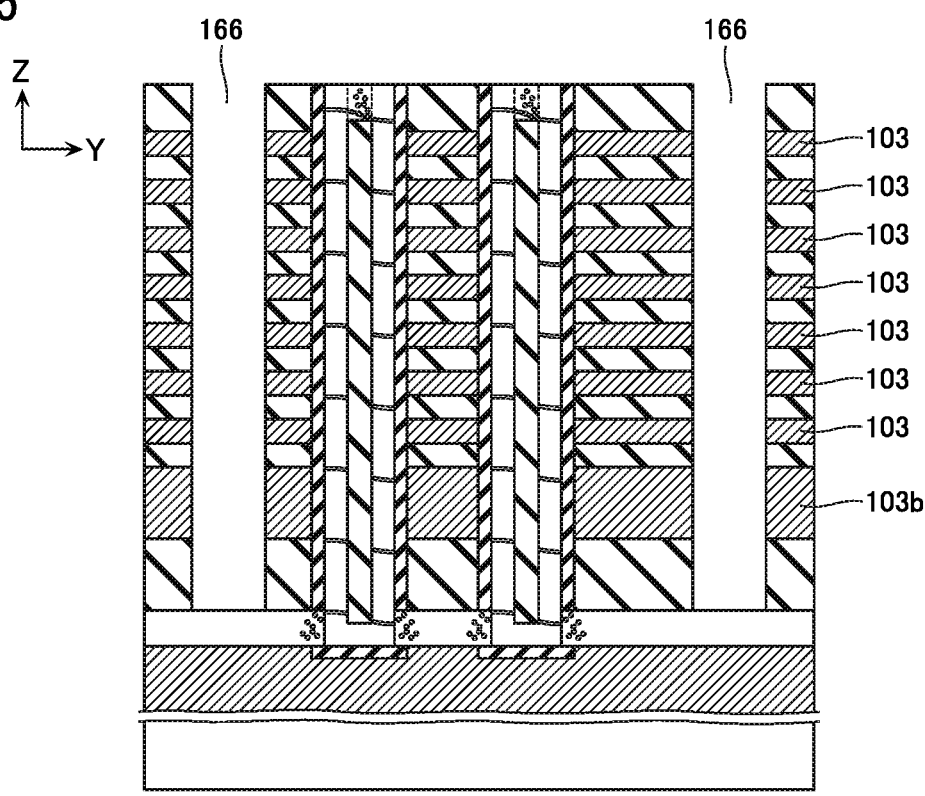
FIG. 25 is a view for describing a method of manufacturing the memory cell array in the semiconductor memory device according to the first embodiment.

Subsequently, as shown in FIG. 25, the opening 168 is filled with the conductive layer 103. The conductive layer 103 is formed of tungsten (W) or the like.

Finally, the interlayer insulating layer 143 and the conductive layer 108 are formed in the grooves 166 to obtain the memory cell array 100 shown in FIG. 5. In this case, the interlayer insulating layer 143 is formed of, for example, silicon dioxide ($SiO_2$) or the like. The conductive layer 108 is formed of tungsten (W) or the like.

The above is the producing process of the memory cell array 100.

In the first embodiment, the channel semiconductor layer 123, which is in an amorphous state, is subjected to the MILC treatment to crystallize it. Accordingly, it is possible to form the channel semiconductor layer 123 using crystalline silicon having a large crystal grain size. As a result, it is possible to increase significantly electron mobility of the channel semiconductor layer 123 more than the channel semiconductor layer 123 formed of polycrystalline silicon.

Moreover, in the first embodiment, the channel semiconductor layer 123 is formed before the MILC treatment. Where there is not the cap semiconductor layer 122, since is not formed before the MILC treatment, the contact between the metal layer 164 and the silicon (Si) is caused only between the bottom surface of the metal layer 164 and the upper surface of the channel semiconductor layer 123, high quality silicide is hardly formed. As a result, the silicide layer progresses unstably in the MILC treatment, and the yield is reduced due to defective crystallization. In this point, since a part of amorphous silicon (a-Si) is consumed by forming the cap insulating layer 122 in the first embodiment, the silicide layer 165 having a high quality can be formed. As a result, since the silicide layer progresses stably in the MILC treatment compared with the case where the cap semiconductor layer 122 is formed after crystallization of the channel semiconductor layer 123, it is possible to suppress reduction of yield due to defective crystallization of the channel semiconductor layer 123.

Furthermore, in the case of the first embodiment, the upper and lower parts of the channel semiconductor layer 123 are brought into contact with the lower semiconductor layer 102 and the cap semiconductor layer 122 which are doped with impurity such as phosphorous (P). Therefore, it is possible to effectively getter the metal atoms 151 remained in the channel semiconductor layer 123 after the MILC treatment, from the top and the bottom. As a result, the channel semiconductor layer 123 can be formed of high quality crystalline silicon.

In summary, according to the first embodiment, it is possible to suppress the reduction of yield that may occur in the process forming channels of memory cells and to provide the semiconductor memory device having improved electric characteristics.

Second Embodiment

There will be described a second embodiment with a focus on a difference from the first embodiment.

First, there will be described a structure of a memory cell array according to the second embodiment. Note that the memory cell array according to the second embodiment is shown under a reference numeral 200 in order to distinguish it from the memory cell array according to the other embodiments.

Figure 26:
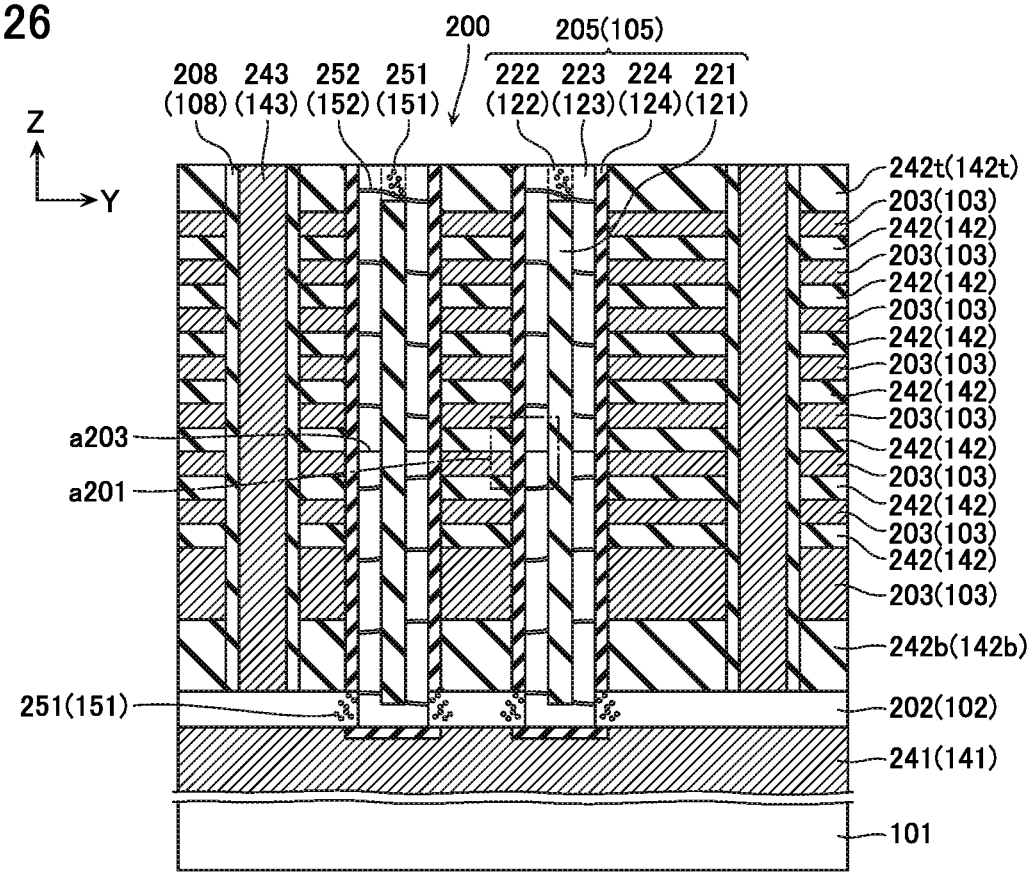
FIG. 26 is a schematic cross-sectional view showing a memory cell array in a semiconductor memory device according to a second embodiment.
Figure 27:
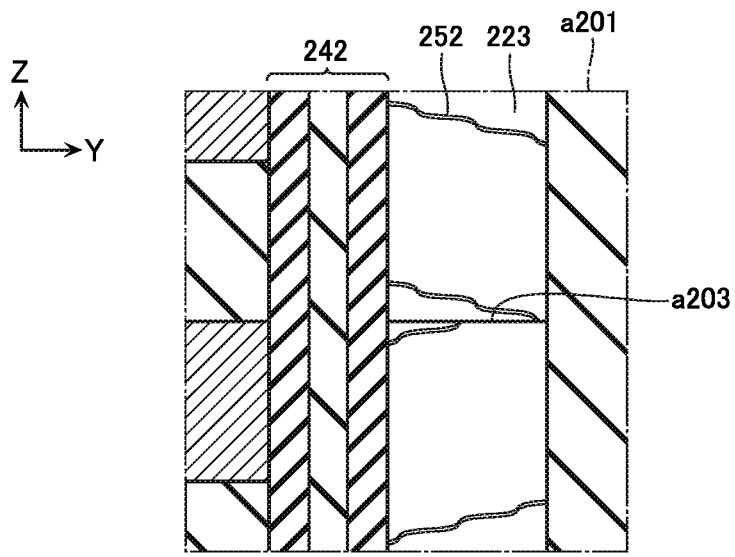
FIG. 27 is a schematic cross-sectional view showing a memory cell array in the semiconductor memory device according to the second embodiment.

FIG. 26 is a schematic cross-sectional view showing a memory cell array 200 in the semiconductor memory device according to the second embodiment. FIG. 27 is an enlarged view of a region a201 surrounded by a dot-and-dash line shown in FIG. 26. FIG. 26 and FIG. 27 are cross-sectional views in the XY plane. Numerals in parentheses in FIG. 26 denote the layers of the memory cell array 100 corresponding to the layers of the memory cell array 200. Note that a reference numeral 252 in FIGS. 26 and 27 denotes a crystal grain boundary in a cap semiconductor layer 222 (corresponding to the cap semiconductor layer 122) and a channel semiconductor layer 223 (corresponding to the channel semiconductor layer 123) schematically shown in FIGS. 26 and 27.

The channel semiconductor layer 223 is formed of a single crystal silicon or a crystalline silicon close to a single crystal silicon, which has a crystal grain size larger than the thickness thereof. The channel semiconductor layer 223 is formed of crystals having different plane orientations across a solid line a203 owing to a producing process described later, unlike the channel semiconductor layer 123.

Next, there will be described a method of manufacturing the memory cell array 200.

First, the same steps as those shown in FIGS. 7 to 12 are performed.

Figure 28:
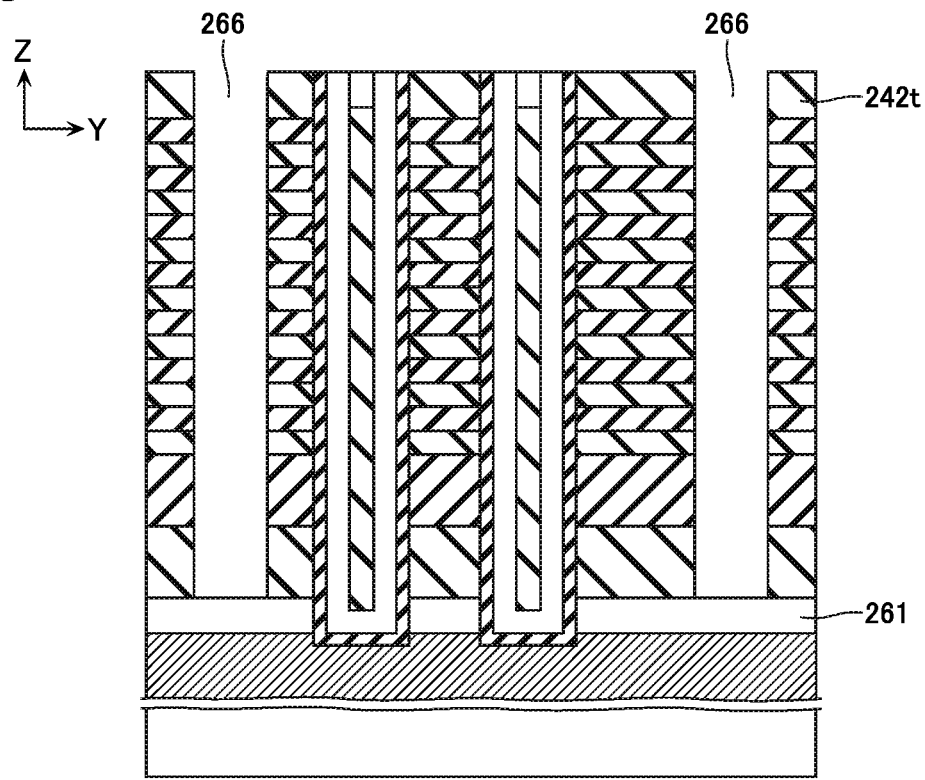
FIG. 28 is a view for describing a method of manufacturing the memory cell array in the semiconductor memory device according to the second embodiment.

Subsequently, as shown in FIG. 28, the resultant structure is subjected to, for example, RIE or the like to form grooves 266 (corresponding to the grooves 166) ranging from an interlayer insulating layer 242t (corresponding to the interlayer insulating layer 142t) to an upper surface of a sacrifice layer 261 (corresponding to the sacrifice layer 161), in which the depth direction thereof is Z direction and the extending direction thereof is X direction.

Figure 29:
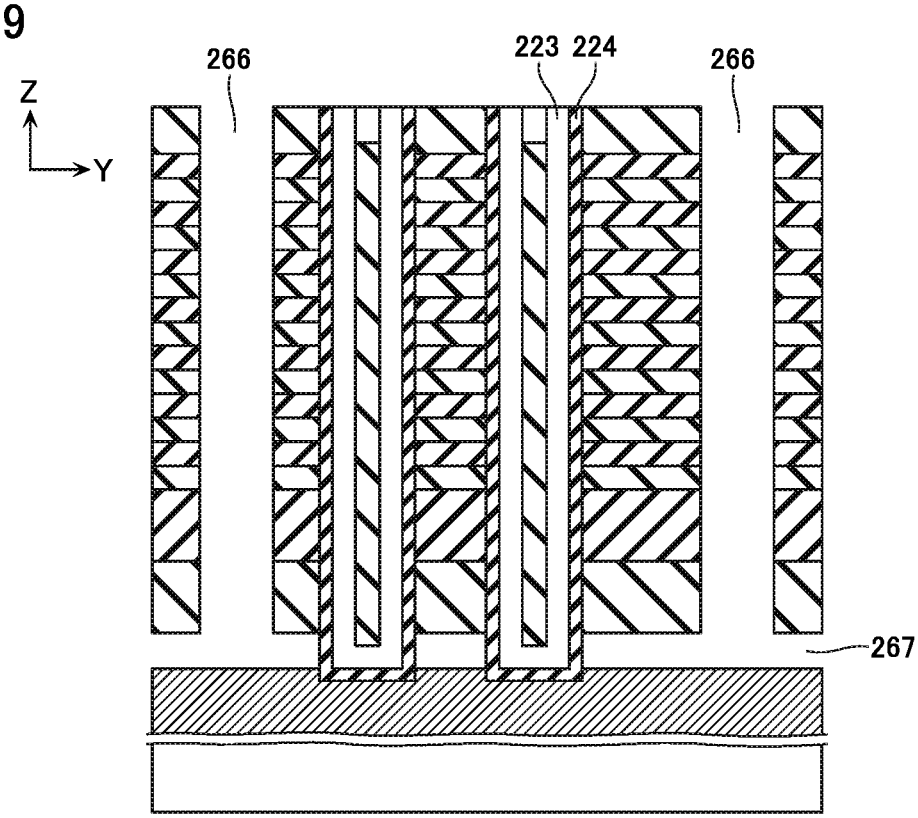
FIG. 29 is a view for describing a method of manufacturing the memory cell array in the semiconductor memory device according to the second embodiment.

Subsequently, as shown in FIG. 29, the sacrifice layer 261 is removed through the grooves 266 by means of a wet etching using a chemical liquid, for example, an aqueous solution of cholin (TMY) or the like. As a result, an opening 267 (corresponding to the opening 167) is formed in the place where the sacrifice layer 261 has been removed.

Figure 30:
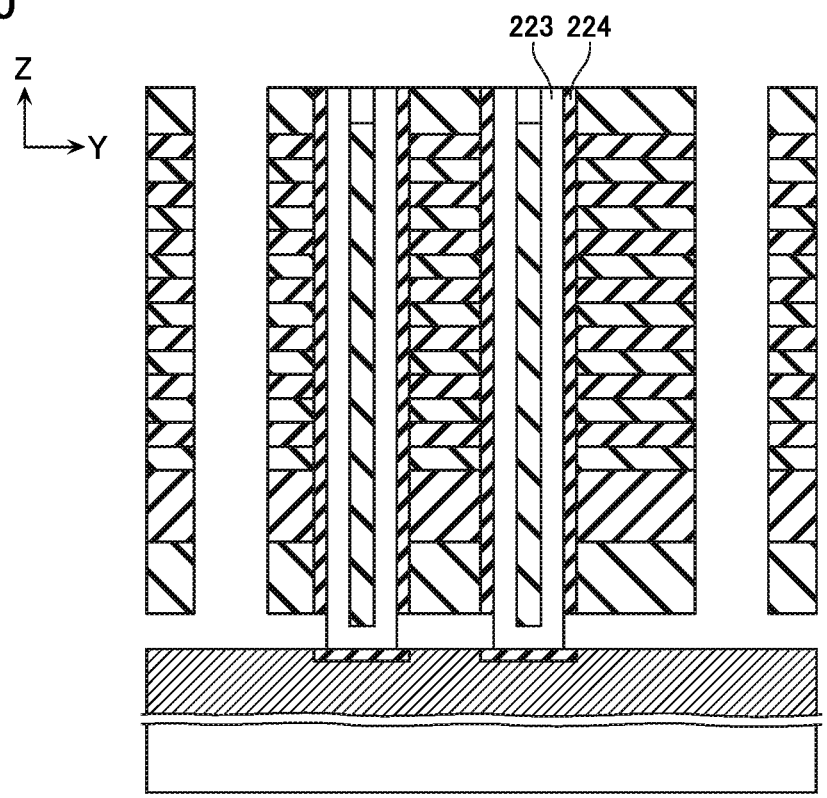
FIG. 30 is a view for describing a method of manufacturing the memory cell array in the semiconductor memory device according to the second embodiment.

Subsequently, as shown in FIG. 30, portions of memory layers 224 (corresponding to the memory layers 124) which are exposed to the opening 267 are removed by means of a wet etching using a chemical liquid, for example, a diluted hydrofluoric acid (DHF). As a result, side surfaces of channel semiconductor layers 223' (corresponding to the channel semiconductor layer 123') are exposed.

Figure 31:
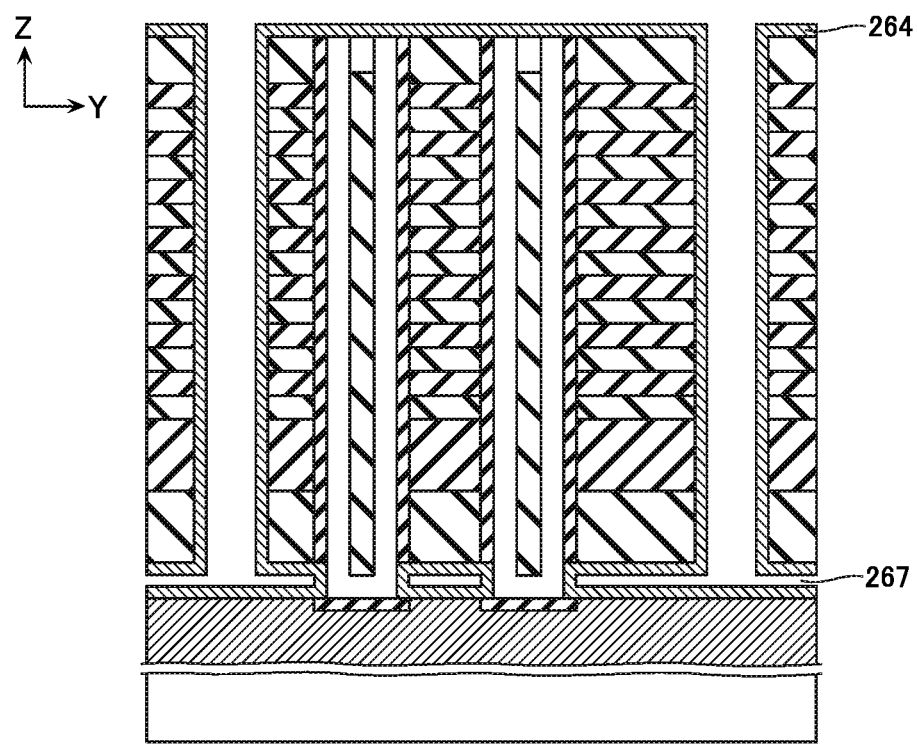
FIG. 31 is a view for describing a method of manufacturing the memory cell array in the semiconductor memory device according to the second embodiment.

Subsequently, as shown in FIG. 31, the opening 267 is deposited with a metal layer 264 by means of, for example, PVD or the like. The metal layer 264 is formed of, for example, nickel (Ni), cobalt (Co), copper (Cu), palladium (Pd) or the like, as with the metal layer 164. In this case, an example using nickel (Ni) is described.

Figure 32:
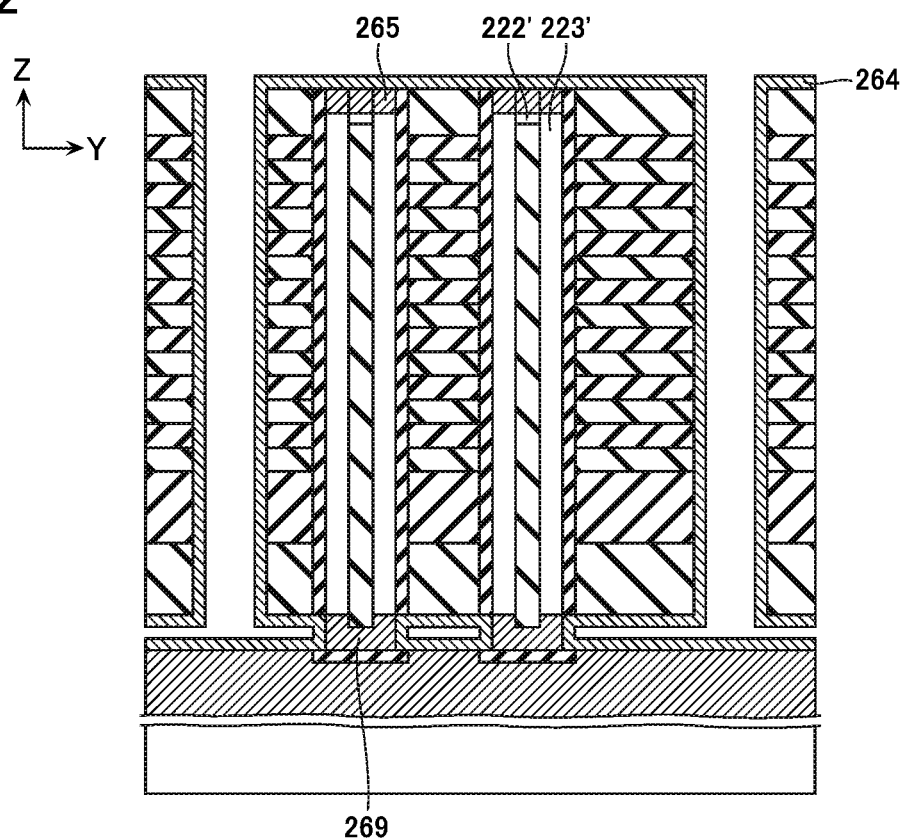
FIG. 32 is a view for describing a method of manufacturing the memory cell array in the semiconductor memory device according to the second embodiment.

Subsequently, as shown in FIG. 32, the metal layer 264 is subjected to heat treatment to diffuse nickel atoms into the upper parts of the semiconductor layers 222' (corresponding to the semiconductor layers 122'), 223' and the lower parts of the semiconductor layers 223', which are in contact with the metal layer 264, thus forming silicide layers 265, 269.

Figure 33:
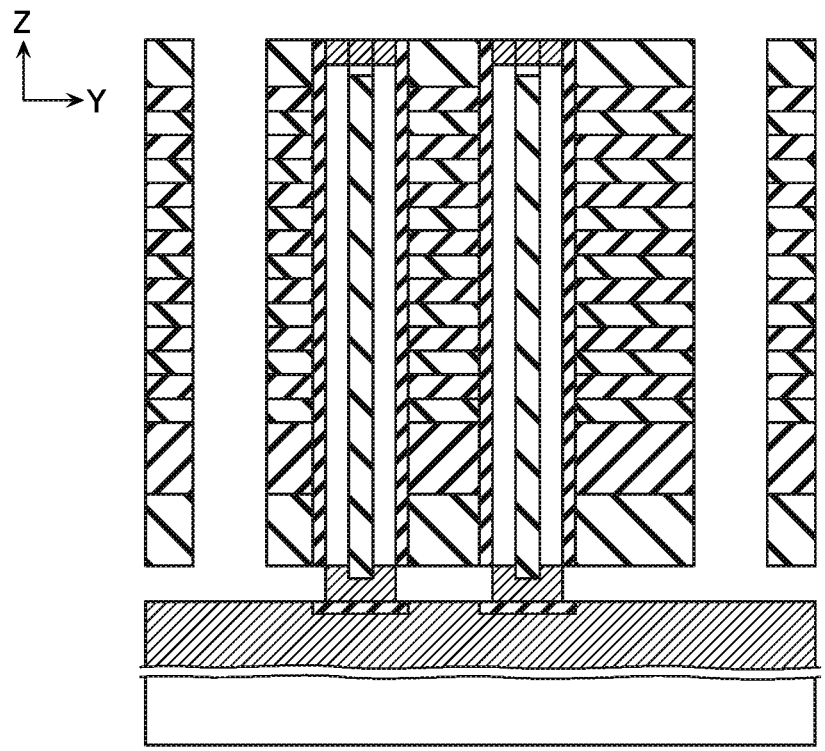
FIG. 33 is a view for describing a method of manufacturing the memory cell array in the semiconductor memory device according to the second embodiment.

Subsequently, as shown in FIG. 33, the metal layer 264 is removed by means of an etching.

Figure 34:
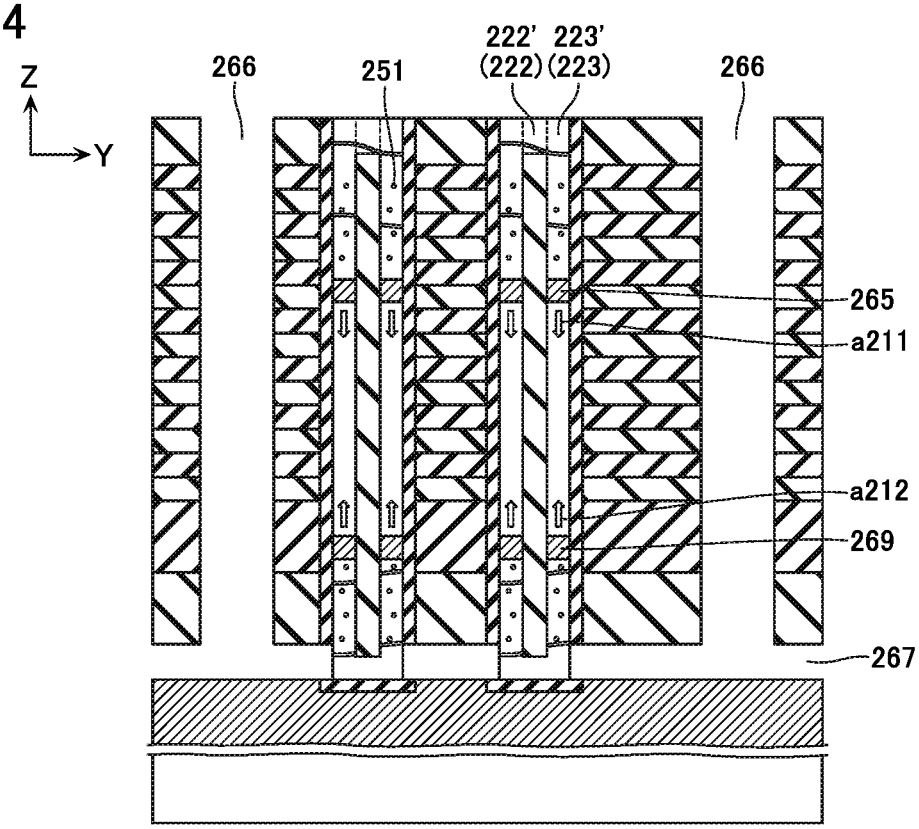
FIG. 34 is a view for describing a method of manufacturing the memory cell array in the semiconductor memory device according to the second embodiment.

Subsequently, as shown in FIG. 34, a metal induced lateral crystallization (MILC) method is performed. According to the MILC treatment, silicide layers 265 and 269 pass through the semiconductor layers 222' and 223' which are in an amorphous state, by heat treatment. Specifically, the silicide layer 265 on the upper end side of the semiconductor layer 223' moves downward (a void arrow a211 in FIG. 34) through the semiconductor layers 222', 223' and the silicide layer 269 on the lower end side of the semiconductor layer 223' moves upward (a void arrow a213 in FIG. 34) through the semiconductor layers 223'. In this case, the amorphous silicon constituting the semiconductor layers 222' and 223' is reformed to form single crystal silicon or crystalline silicon having a relatively large grain size close to that of single crystal silicon. As a result, the semiconductor layers 222' and 223' become the cap semiconductor layer 222 and the channel semiconductor layer 223. At this point, however, the metal atoms 251 of nickel (Ni) remain in the channel semiconductor layer 223.

The MILC treatment in the second embodiment is performed using both of the silicide layer 265 moving downward and the silicide layer 269 moving upward as growth ends. Therefore, the plane orientation of a part of the channel semiconductor layer 223 positioned upwardly of the solid line a203 shown in FIG. 26 is different from the plane orientation of the other part of the channel semiconductor layer 223 positioned downwardly of the solid line a203. Note that if the moving speeds of the silicide layers 265, 269 in the semiconductor layer 223' are substantially the same, the solid line a203 is positioned at the center of the channel semiconductor layer 223 or around it in the Z direction. If the moving speeds of the silicide layers 265, 269 in the semiconductor layer 223' differ from each other, the solid line a203 shifts upward or downward from the center of the channel semiconductor layer 223 in the Z direction.

Subsequently, in the same manner as the step shown in FIG. 21, the opening 267 is filled with a lower semiconductor layer 202 (corresponding to the lower semiconductor layer 102). The lower semiconductor layer 202 is formed of polycrystalline silicon doped with impurity such as phosphorus (P) at a concentration of $10^{20}/cm^3$ or more, like the lower semiconductor layer 102.

Subsequently, in the same manner as the step shown in FIG. 22, the channel semiconductor layer 223 is subjected to heat treatment to getter the metal atoms 251 in the channel semiconductor layer 223. The gettered metal atoms 251 are recovered in the lower semiconductor layer 202 and the cap semiconductor layer 222. As a result, it is possible to obtain the channel semiconductor layer formed of high quality crystalline silicon from which the metal atoms are removed.

Finally, the interlayer insulating layer 243 (corresponding to the interlayer insulating layer 143) and the conductive layer 208 (corresponding to the conductive layer 108) are formed in the grooves 266 to obtain the memory cell array 200 shown in FIG. 26.

The above is the producing process of the memory cell array 200.

According to the second embodiment, the same advantage as that of the first embodiment is obtained. Additionally, it is possible to shorten the time required for the MILC treatment since the MILC treatment is performed from the both sides of the upper end and lower end of the semiconductor layer 222'.

Third Embodiment

In the first embodiment, the metal atoms 151 remained in the channel semiconductor layer 123 are gettered to recover them in the lower semiconductor layer 102 via the side surface of the channel semiconductor layer 123. However, gettering of the metal atoms in the channel semiconductor layer is not limited to this aspect. Hereinafter, an application example of a memory cell array having a structure different from that of the first embodiment will be described with a focus on a difference from the first embodiment.

First, there will be described a structure of a memory cell array according to the third embodiment. Note that the memory cell array according to the third embodiment is shown under a reference numeral 300 in order to distinguish it from the memory cell array according to the other embodiments.

Figure 35:
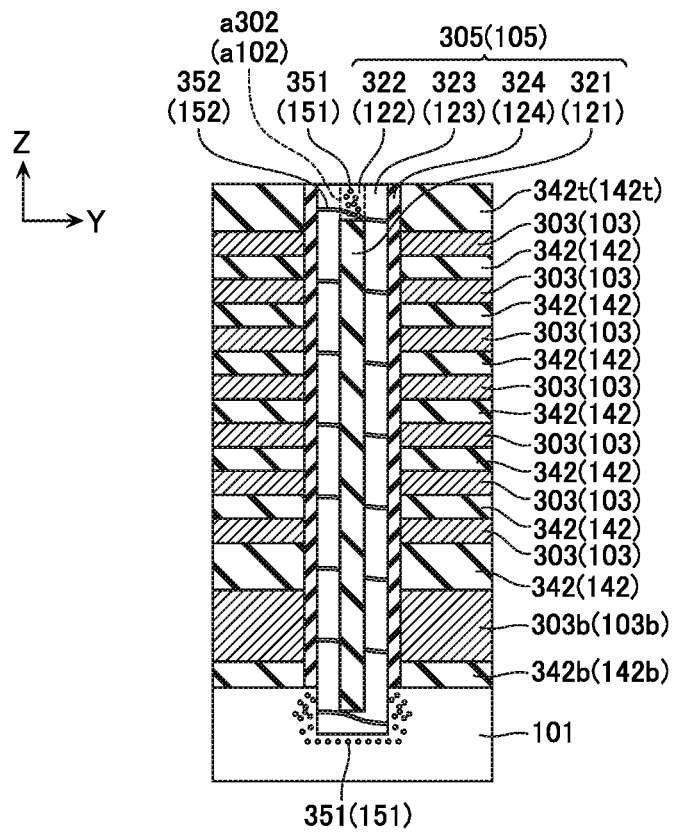
FIG. 35 is a schematic cross-sectional view showing a memory cell array in a semiconductor memory device according to a third embodiment.

FIG. 35 is a schematic cross-sectional view showing a memory cell array 300 in the semiconductor memory device according to the third embodiment. FIG. 35 is a sectional view of a part of a memory cell array 305 (corresponding to the memory cell array 105) in the XY plane. Numerals in parentheses in FIG. 35 denote the layers of the memory cell array 100 corresponding to layers of the memory cell array 300. Note that a reference numeral 352 in FIG. 35 denotes a crystal grain boundary in a cap semiconductor layer 322 (corresponding to the cap semiconductor layer 122) and a channel semiconductor layer 323 (corresponding to the channel semiconductor layer 123) schematically shown in FIG. 35.

Since the memory cell array 300 does not include the layer corresponding to the lower semiconductor layer 102, electrons or holes move between the channel semiconductor layer 323 and a source line contact LI via the semiconductor substrate 101.

The channel semiconductor layer 323 (corresponding to the channel semiconductor layer 123) is in contact with the upper part of the semiconductor substrate 101 on the bottom surface thereof. The connecting region of the semiconductor substrate 101 connected to the channel semiconductor layer 323 is doped with impurity such as phosphorous (P) at a concentration of $10^{20}/cm^3$ or more like the lower semiconductor layer 102 of the memory cell array 100.

The cap semiconductor layer 322 and the channel semiconductor layer 323 are similar to the cap semiconductor layer 122 and the channel semiconductor layer 123 of the memory cell array 100. Namely, the cap semiconductor layer 322 and the channel semiconductor layer 323 are formed of polycrystalline silicon having a crystal grain size larger than the thickness thereof. Additionally, although the cap semiconductor layer 322 and the channel semiconductor layer 323 are distinguished from each other by a dot line a302, it does not mean that these layers are divided at the position of the dot line a302. Moreover, the cap semiconductor layer 322 is doped with impurity such as phosphorous (P) at a concentration of $10^{20}/cm^3$ or more.

Next, there will be described a method of producing the memory cell array 300.

Figure 36:
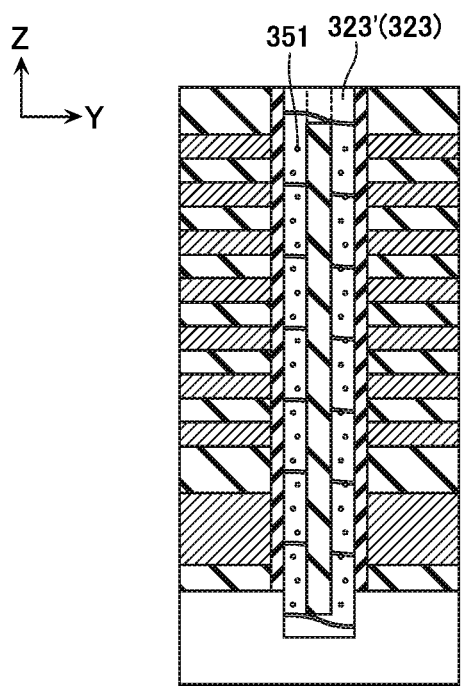
FIG. 36 is a view for describing a method of manufacturing the memory cell array in the semiconductor memory device according to the third embodiment.

Also in the third embodiment, the semiconductor layer 323' is subjected to the MILC treatment in the same manner as the case in the first embodiment. As a result, it is possible to obtain the channel semiconductor layer 323 formed of crystalline silicon having a large grain size. As shown in FIG. 36, however, metal atoms 351 (corresponding to the metal atoms 151) is remained in the channel semiconductor layer 323 immediately after the MILC treatment.

Figure 37:
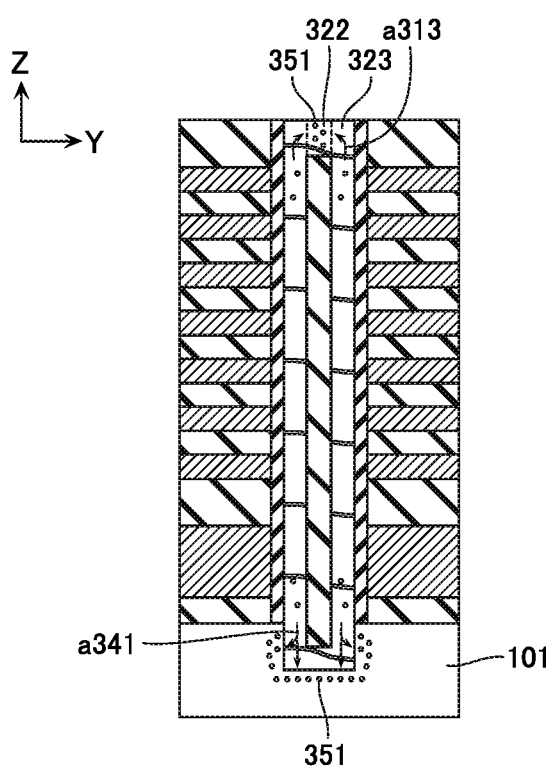
FIG. 37 is a view for describing a method of manufacturing the memory cell array in the semiconductor memory device according to the third embodiment.

Accordingly, also in the third embodiment, the channel semiconductor layer 323 is subjected to heat treatment to getter the metal atoms 351 in the same manner as the first embodiment. In the case of the third embodiment, the metal atoms 351 are recovered in the cap semiconductor layer 322 from the upper part of the channel semiconductor layer 323 (arrow a313 in FIG. 37) and is also recovered in the semiconductor substrate 101 from the lower part including the bottom surface of the channel semiconductor layer 323 (arrow a341 in FIG. 37).

In order to getter the metal atoms in the channel semiconductor layer 323, the channel semiconductor layer 323 may be brought into contact with the semiconductor doped with impurity such as phosphorous (P) (the lower semiconductor layer 102 and the cap semiconductor layer 122 in the case of the first embodiment) and subjected to heat treatment as shown in FIG. 22. Namely, the channel semiconductor layer 323 may be brought into contact with the lower semiconductor layer on the side surface thereof like the first embodiment, or brought into contact with the semiconductor substrate doped with impurity on the bottom surface thereof like the third embodiment. Certainly, in case that there is the lower semiconductor layer like the memory cell array 100, the channel semiconductor layer 323 may be brought into contact with the lower semiconductor layer on the bottom surface thereof. In either case, it is possible to recover the metal atoms from the channel semiconductor layer.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a substrate;
a plurality of first conductive layers arranged in a first direction intersecting a surface of the substrate;
a channel semiconductor layer extending in the first direction and including a first portion facing the plurality of the first conductive layers, a second portion further from the substrate than the first portion, and, a third portion nearer to the substrate than the first portion, the channel semiconductor layer including a crystal grain having a crystal grain size larger than a thickness in a second direction of the channel semiconductor layer, the second direction intersecting the first direction;
a memory layer arranged between the first portion of the channel semiconductor layer and the plurality of the first conductive layers and including a memory part capable of storing data;
a first semiconductor layer directly contacting with the second portion of the channel semiconductor layer, the first semiconductor layer including crystalline semiconductor containing phosphorous; and
a second semiconductor layer directly contacting with the third portion of the channel semiconductor layer, the second semiconductor layer including phosphorous.

2. The semiconductor memory device according to claim 1, wherein
the second semiconductor layer is a part of the substrate,
the substrate is directly contacting with the third portion of the channel semiconductor layer, and
a connecting region of the substrate connected to the channel semiconductor layer contains phosphorous.

3. A semiconductor memory device, comprising:
a substrate;
a plurality of first conductive layers arranged in a first direction intersecting a surface of the substrate;
a channel semiconductor layer extending in the first direction and including a first portion facing the plurality of the first conductive layers and a second portion nearer to the substrate than the first portion, the channel semiconductor layer including a crystal grain having a crystal grain size larger than a thickness in a second direction of the channel semiconductor layer, the second direction intersecting the first direction;
a memory layer arranged between the first portion of the channel semiconductor layer and the plurality of the first conductive layers and including a memory part capable of storing data; and
a first semiconductor layer directly contacting with the second portion of the channel semiconductor layer, the first semiconductor layer including phosphorous in a portion connected to the channel semiconductor layer.

4. The semiconductor memory device according to claim 3, wherein
the first semiconductor layer is a part of the substrate,
the substrate is directly contacting with the second portion of the channel semiconductor layer, and
a connecting region of the substrate connected to the channel semiconductor layer contains phosphorous.

5. The semiconductor memory device according to claim 3, wherein
the first semiconductor layer includes a portion nearer to the first portion of the channel semiconductor layer than one end in the first direction of the channel semiconductor layer.

6. The semiconductor memory device according to claim 1, wherein
the second semiconductor layer includes a portion nearer to the first portion of the channel semiconductor layer than one end in the first direction of the channel semiconductor layer.

* * * * *